United States Patent
Nakano et al.

(10) Patent No.: US 9,905,766 B2
(45) Date of Patent: Feb. 27, 2018

(54) POLYMER AND SOLAR CELL USING THE SAME

(71) Applicant: Kabushiki Kaisha Toshiba, Minato-ku (JP)

(72) Inventors: Yoshihiko Nakano, Yokohama (JP); Shigehiko Mori, Kawasaki (JP); Takeshi Gotanda, Yokohama (JP); Fumihiko Aiga, Yokohama (JP); Rumiko Hayase, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 22 days.

(21) Appl. No.: 15/075,740

(22) Filed: Mar. 21, 2016

(65) Prior Publication Data
US 2016/0285002 A1     Sep. 29, 2016

(30) Foreign Application Priority Data

Mar. 24, 2015 (JP) ................................. 2015-061585

(51) Int. Cl.
*H01B 1/06* (2006.01)
*C08G 2/00* (2006.01)
(Continued)

(52) U.S. Cl.
CPC ........ *H01L 51/0036* (2013.01); *C08G 61/126* (2013.01); *C08G 2261/12* (2013.01);
(Continued)

(58) Field of Classification Search
CPC ............ H01L 51/0036; H01L 51/4253; C08G 61/126; C08G 2261/91; C08G 2261/228;
(Continued)

(56) References Cited

U.S. PATENT DOCUMENTS

2011/0017956 A1*  1/2011  Hou ...................... B82Y 10/00
                                                      252/511
2011/0124822 A1   5/2011  Yu et al.
(Continued)

FOREIGN PATENT DOCUMENTS

JP    2012-241016    12/2012
JP    2013-523931    6/2013
(Continued)

OTHER PUBLICATIONS

Lijun Huo et al. "Replacing Alkoxy Groups with Alkylthienyl Groups: A Feasible Approach to Improve the Properties of Photovoltaic Polymers", Angew. Chem. Int. Ed., 2011, pp. 9697-9702.
(Continued)

*Primary Examiner* — William Cheung
(74) *Attorney, Agent, or Firm* — Oblon, McClelland, Maier & Neustadt, L.L.P.

(57) ABSTRACT

A polymer of an embodiment includes a repeating unit containing at least one bivalent group selected from the following formula (1) and the following formula (2).
(Continued)

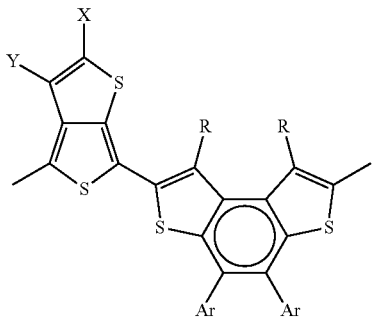

(1)

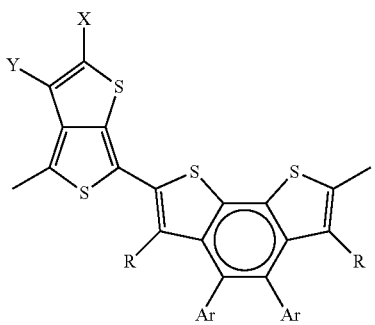

(2)

In the formulas (1) and (2), R is hydrogen, fluorine, an alkyl group, an aryl group, a heteroaryl group, or the like. X and Y are each an alkanoyl group, an aminocarbonyl group, an alkylsulfonyl group, or the like. Ar is an aryl group or a heteroaryl group.

16 Claims, 1 Drawing Sheet

(51) Int. Cl.
*H01L 51/00* (2006.01)
*C08G 61/12* (2006.01)
*H01L 51/42* (2006.01)

(52) U.S. Cl.
CPC . *C08G 2261/122* (2013.01); *C08G 2261/124* (2013.01); *C08G 2261/146* (2013.01); *C08G 2261/149* (2013.01); *C08G 2261/1412* (2013.01); *C08G 2261/1426* (2013.01); *C08G 2261/1428* (2013.01); *C08G 2261/228* (2013.01); *C08G 2261/3223* (2013.01); *C08G 2261/3243* (2013.01); *C08G 2261/414* (2013.01); *C08G 2261/91* (2013.01); *H01L 51/4253* (2013.01); *Y02E 10/549* (2013.01)

(58) Field of Classification Search
CPC .......... C08G 2261/12; C08G 2261/122; C08G 2261/124; C08G 2261/1412; C08G 2261/1426; C08G 2261/1428; C08G 2261/146; C08G 2261/149; C08G 2261/3223; C08G 2261/3243; C08G 2261/414; Y02E 10/549
USPC .......................................... 252/511; 528/220
See application file for complete search history.

(56) References Cited

U.S. PATENT DOCUMENTS

| 2013/0123449 A1 | 5/2013 | Hou et al. |
| 2014/0005347 A1 | 1/2014 | Yu et al. |
| 2014/0235817 A1 | 8/2014 | Yu et al. |

FOREIGN PATENT DOCUMENTS

| JP | 2015-10173 | 1/2015 |
| WO | WO 2010/008672 A1 | 1/2010 |
| WO | WO 2011/011545 A1 | 1/2011 |
| WO | WO 2011/120951 A1 | 10/2011 |
| WO | WO 2014/208011 A1 | 12/2014 |

OTHER PUBLICATIONS

Mikkel Jorgensen et al. "Stability of Polymer Solar Cells", Advanced Materials, vol. 24, 2012, pp. 580-612.
Jin Hyuck Heo et al. "Efficient Inorganic-Organic Hybrid Heterojunction Solar Cells Containing Perovskite Compound and Polymeric Hole Conductors", Nature Photonics, vol. 7, Jun. 2013, pp. 486-491.

* cited by examiner

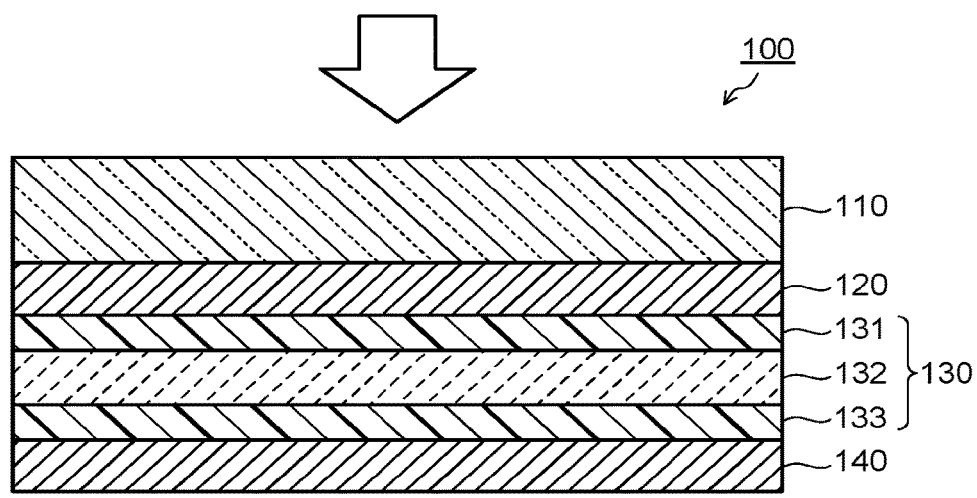

POLYMER AND SOLAR CELL USING THE SAME

CROSS-REFERENCE TO RELATED APPLICATION

This application is based upon and claims the benefit of priority from Japanese Patent Application No. 2015-061585, filed on Mar. 24, 2015; the entire contents of all of which are incorporated herein by reference.

FIELD

Embodiments described herein relate generally to a polymer and a solar cell using the same.

BACKGROUND

An organic semiconductor is expected to be applied to a photoelectric conversion element such as a solar cell, a light emitting element, and a photosensor. Especially, using a high molecular compound as an organic semiconductor material enables application of a low-cost coating method in fabrication of an active layer. In view of an energy demand and an emission reduction of $CO_2$, a solar cell is expected as one of clean energies with low environmental burdens and its demand is rapidly increasing. A silicon-based solar cell is mainstream at present, but efficiency thereof is about 15%, and it is difficult to curtail a cost. A CdTe solar cell is also known as a solar cell which can be fabricated at a low cost. However, since Cd being a toxic element is used, there is a possibility that an environmental problem occurs. Under the circumstances, practical use of an organic thin film solar cell and an organic/inorganic hybrid solar cell is expected as a next-generation solar cell which is low in cost, high in energy conversion efficiency, and nontoxic.

In order to put an organic thin film solar cell to practical use, improvement of power generation efficiency is intensely demanded, and for this purpose, organic thin film solar cells using organic semiconductors made of a variety of high modular compounds are studied. For example, as a polymer exhibiting conversion efficiency as high as 7% or more when applied to an organic thin film solar cell, there is known poly(4,8-bis(2-ethylhexyloxy)benzo[1,2-b:4,5-b']dithiophene-2,6-diyl-alt-4-(2-ethylhexyloxycarbonyl)-5-fluoro-thieno[3,4-b]thiophene-2,6-diyl) (abbreviated form: PTB-7). Further, there is also known a polymer (abbreviated form: PBDTTT-CF) made by substituting a carbonyl group (n-heptylcarbonyl group) which is strong in electron withdrawing property for an ester substituent at 4-position of a thieno[3,4-b]thiophene ring of PTB-7, in order to improve an open circuit voltage (Voc) of an organic thin film solar cell.

Synthetic pathways of monomers of the aforementioned polymers (PTB-7 and PBDTTT-CF) are multi-stepped and quite complicated. In order to decrease synthetic stages, there is developed poly{4,8-bis(2-ethylhexyloxy)benzo[1,2-b:4,5-b']dithiophene-2,6-diyl-alt-4-(2-heptylcarbonyl)-thieno[3,4-b]thiophene-2,6-diyl} (abbreviated form: PDBTTT-C) in which hydrogen is substituted for fluorine of 5-position of thieno[3,4-b]thiophene of the PBDTTT-CF, but with this polymer, conversion efficiency is slightly decreased. With regard to the PDBTTT-C, it is known that the conversion efficiency is improved by replacing a 2-ethylhexyloxy group of substituents of 4-position and 8-position of a benzo[1,2-b:4,5-b']dithiophene ring with a 5-(2-ethylhexyl) thienyl group.

As described above, conversion efficiency of a solar cell is largely affected not only by a skeletal structure of an organic semiconductor made of an organic high molecular compound but also by a side chain of the organic high molecular compound. Therefore, in order to improve performance of an organic thin film solar cell using the organic semiconductor, it is required to improve the skeletal structure and the side chain of the organic high molecular compound. Further, improvement of a life property in addition to improvement of an open circuit voltage is required of the organic thin film solar cell. In order to improve the life of the organic thin film solar cell, active substances (a donor and an acceptor) excellent in light stability and heat stability are required.

Further, researches have recently been made on an organic/inorganic hybrid solar cell whose energy conversion efficiency is improved by using an organic/inorganic hybrid perovskite compound or an inorganic perovskite compound for a photoelectric conversion layer. In the organic/inorganic hybrid solar cell, polyarylamine or 2,2',7,7'-tetrakis(N,N-methoxyphenylamine)-9,9'-spirobifluorene (spiro-OMeTAD) is used as a hole transport layer. Further, in order to enhance conversion efficiency, a dopant such as t-butylpyridine (TBP) or bis(trifluoromethanesulfonyl)imidelithium (Li-TFSI) is used. However, since TBP is liquid and Li-TFSI is a hygroscopic substance, there occurs performance deterioration caused by diffusion or dissipation of TBP to the photoelectric conversion layer due to a temperature increase, by absorption of water molecules due to deliquescence of Li-TFSI, and so on. This is a cause to shorten the life of the organic/inorganic hybrid solar cell. It has been also proposed to use P3HT being a p-type material as the hole transport layer, but sufficient power generation efficiency cannot be obtained in this case.

BRIEF DESCRIPTION OF THE DRAWINGS

The FIGURE is a cross-sectional view showing a configuration of a solar cell of an embodiment.

DETAILED DESCRIPTION

According to one embodiment, there is provided a polymer having a repeating unit containing at least one selected from a bivalent group represented by the following formula (1) and a bivalent group represented by the following formula (2).

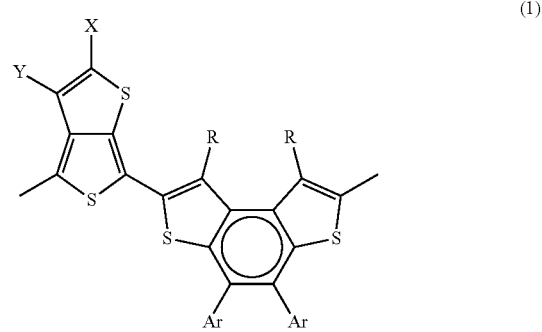

(1)

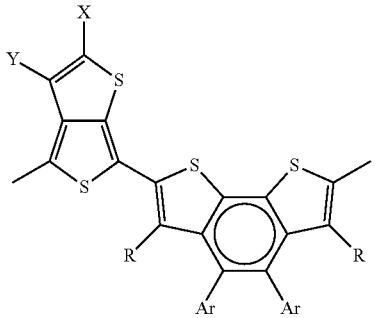

(2)

In the formula (1) and the formula (2), R group is a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group. X group and Y group are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded. Ar group is a monovalent group selected from a substituted or unsubstituted awl group and a substituted or unsubstituted heteroaryl group.

Hereinafter, a polymer of an embodiment and a solar cell using the same will be described. Concrete structures of the polymer of the embodiment will be described in detail below.

[First Polymer]

A first polymer in the embodiment is an organic high molecular compound including at least one of a repeating unit of the bivalent group represented by the following formula (1) and a repeating unit of the bivalent group represented by the following formula (2). A weight-average molecular weight of the first polymer is preferably in a range of 3000 to 1000000.

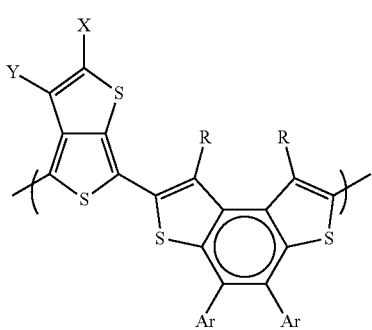

(1)

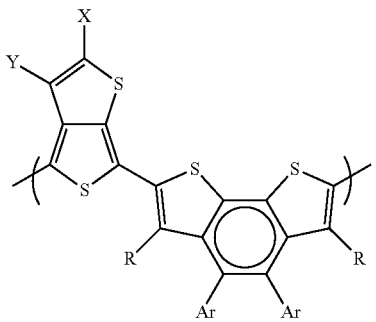

(2)

In the formula (1) and the formula (2), R group is a monovalent group selected from hydrogen (H), fluorine (F), a cyano group (—CN), a nitro group (—NO$_2$), a substituted or unsubstituted alkyl group, a substituted or unsubstituted alkoxy group, a substituted or unsubstituted aryl group, and a substituted or unsubstituted heteroaryl group. X group and Y group are each independently a monovalent group selected from hydrogen (H), fluorine (F), a cyano group (—CN), a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which X and Y are bonded. The X group and the Y group may be the same or may be different. Further, the X group and the Y group may form the condensed ring by an imide bond or the like. Ar group is a monovalent group selected from a substituted or unsubstituted aryl group and a substituted or unsubstituted heteroaryl group.

In the R group, it is preferable that a carbon number of the substituted or unsubstituted alkyl group is in a range of 1 to 30. The substituted or unsubstituted alkyl group may be any one of straight-chained, branched-chained, and cyclic alkyl groups. As concrete examples of such an alkyl group, there can be cited a methyl group, an ethyl group, a propyl group, an isopropyl group, a butyl group, a pentyl group, a hexyl group, an octyl group, an isooctyl group, a 2-ethylhexyl group, a nonyl group, a decyl group, a dodecyl group, an octadecyl group, a 2-hexadecyl group, an octadodecyl group, a trifluoromethyl group, a pentafluoroethyl group, a perfluorohexyl group, a perfluorooctyl group, and so on, but the above alkyl group is not limited thereto.

A carbon number of the substituted or unsubstituted alkoxy group (—ORx) is preferably in a range of 1 to 30. The substituted or unsubstituted alkoxy group may be any one of straight-chained, branched-chained, and cyclic alkoxy groups. As concrete examples of such a substituted or unsubstituted alkoxy group, there can be cited a methoxy group, an ethoxy group, a propoxy group, a butoxy group, a hexyloxy group, an octyloxy group, a 2-ethylhexyloxy group, and so on, but the above alkoxy group is not limited to these. An Rx group in the alkoxy group is not limited to an alkyl group but may be an aromatic group, a heterocyclic group, or the like.

Carbon numbers of the substituted or unsubstituted aryl group and heteroaryl group are preferably in a range of 4 to 20. As concrete examples of the substituted or unsubstituted aryl group and heteroaryl group, there can be cited a phenyl group, a naphthyl group, a 4-biphenyl group, a 2-thienyl group, a 2-furanyl group, a 4-tolyl group, a 4-octylphenyl group, a 4-(2-ethylhexyl)biphenyl group, a 2-(2-ethylhexyl) thienyl group, a 2-(5-ethylhexyl)furanyl group, and so on, but the above aryl group and heteroaryl group are not limited to these.

In the X group and the Y group, it is preferable that a carbon number of the substituted or unsubstituted alkanoyl group (—C(=O)Ry) is in a range of 1 to 30. The substituted or unsubstituted alkanoyl group may be any one of straight-chained, branched-chained, and cyclic alkanoyl groups. As concrete examples of the substituted or unsubstituted alkanoyl group, there can be cited an acetyl group, a propanoyl group, a butanoyl group, a pentanoyl group, a hexanoyl group, an octanoyl group, a 2-ethylhexanoyl group, a nonanoyl group, a decanoyl group, a dodecanoyl group, an octadecanoyl group, a 2-hexadecanoyl group, an octadodecyl group, a trifluoroacetyl group, a pentafluoropropanoyl group, a perfluorohexanoyl group, a perfluorooctanoyl group, and so on, but the above alkanoyl group is not limited to these. An Ry group in the alkanoyl group is not limited to an alkyl group but may be an aromatic group, a heterocyclic group, and so on.

A carbon number of the substituted or unsubstituted aminocarbonyl group is preferably in a range of 1 to 30. The substituted or unsubstituted aminocarbonyl group may be any one of straight-chained, branched-chained, and cyclic aminocarbonyl groups. As concrete examples of the substituted or unsubstituted aminocarbonyl group, there can be cited an N-(2-ethylhexyl)aminocarbonyl group, an N-(octyl) aminocarbonyl group, an N-(4-octylphenyl)aminocarbonyl group, and so on, but the above aminocarbonyl group is not limited to these.

A carbon number of the substituted or unsubstituted alkoxycarbonyl group (—COORz) is preferably in a range of 1 to 30. The substituted or unsubstituted alkoxycarbonyl group may be any one of straight-chained, branched-chained, and cyclic alkoxycarbonyl groups. As concrete examples of the substituted or unsubstituted alkoxycarbonyl group, there can be cited a 2-ethylhexyloxycarbonyl group, an octyloxycarbonyl group, a hexyloxycarbonyl group, and so on, but the above alkoxycarbonyl group is not limited to these. An Rz group in the alkoxycarbonyl group is not limited to an alkyl group, but may be an aromatic group, a heterocyclic group, and so on.

Carbon numbers of the substituted or unsubstituted alkylsulfinyl group (—S(=O)—Rw1), the substituted or unsubstituted arylsulfinyl group (—S(=O)—Rw2), the substituted or unsubstituted alkylsulfonyl group (—S(=O)$_2$—Rw1), and the substituted or unsubstituted arylsulfonyl group (—S(=O)$_2$—Rw2) are preferably in a range of 1 to 30. The substituted or unsubstituted alkylsulfinyl group, the substituted or unsubstituted arylsulfinyl group, the substituted or unsubstituted alkylsulfonyl group, and the substituted or unsubstituted arylsulfonyl group may be any one of straight-chained, branched-chained, and cyclic ones. As concrete examples of these groups, there can be cited an octylsulfinyl group, a 2-ethylhexylsulfinyl group, a 4-2-(ethylhexyl)phenylsulfinyl group, an octylsulfonyl group, a 2-ethylhexylsulfonyl group, a 4-(2-ethylhexyl)phenylsulfonyl group, and so on, but the above groups are not limited to these. An Rw1 group and an Rw2 group in the sulfinyl group and the sulfonyl group each are not limited only to an alkyl group and an aromatic group but may include a heterocyclic group and so on.

In the Ar group, carbon numbers of the substituted or unsubstituted aryl group and heteroaryl group are preferably in a range of 4 to 20. As concrete examples of the substituted or unsubstituted aryl group and heteroaryl group, there can be cited a phenyl group, a naphthyl group, a 4-biphenyl group, a 2-thienyl group, a 2-furanyl group, a 4-tolyl group, a 4-octylphenyl group, a 4-(2-ethylhexyl)biphenyl group, a 2-(2-ethylhexyl)thienyl group, a 2-(5-ethylhexyl)furanyl group, and so on, but the above aryl group and heteroaryl group are not limited to these.

The first polymer in the embodiment has a characteristic as a p-type semiconductor material, and for example, is used as p-type semiconductor materials of an active layer and a buffer layer in a photoelectric conversion layer of a solar cell. In the repeating units of the bivalent group represented by the formula (1) and the formula (2), a ring structure in which two thiophene rings are bonded to ortho positions of a benzene ring is not only excellent in electron withdrawing property but also excellent in light stability and heat stability. Therefore, by employing such a ring structure, it is possible to realize a polymer (p-type semiconductor material) low in HOMO energy level and excellent in light stability and heat stability. For example, by forming an active layer by combining the p-type semiconductor material made of the polymer of the embodiment and an n-type semiconductor material, it is possible to improve both properties such as power generation efficiency and life of an organic thin film solar cell. Further, by using the p-type semiconductor material made of the polymer of the embodiment as a hole extraction layer, it is possible to improve heat resistance and a life property and so on based on this while maintaining properties of an organic/inorganic hybrid solar cell. Note that, in the later-described second and third polymers, basic properties are the same.

The weight-average molecular weight of the polymer including the repeating unit of the bivalent group represented by the formula (1) or the formula (2) is in the range of 3000 to 1000000, and in such a case, good solubility and semiconductor characteristics can be obtained. It is preferable that the weight-average molecular weight of the polymer is in a range of 10000 to 600000. The weight-average molecular weight indicates a weight-average molecular weight of polystyrene conversion measured by a gel permeation chromatography method. Further, in order to impart good solubility to the polymer, at least one of the R group, the X group, and the Y group is preferably a substituted or unsubstituted alkyl group whose carbon number is 6 or more. The same applies to the later-described second and third polymers.

The repeating units of the bivalent group represented by the formula (1) or the formula (2) are sometimes bonded cyclically by themselves to constitute the polymer, but in general, the repeating units each include end groups (Rt groups). As the end group Rt, a monovalent group similar to the aforesaid R group is employed. The first polymer in the embodiment may be constituted only by the repeating unit of the bivalent group represented by the formula (1) or the formula (2), or may include a repeating unit other than those represented by the formula (1) and the formula (2). However, when the number of moles of the repeating units of the bivalent group represented by the formula (1) and the formula (2) is less than 50 mol %, a semiconductor characteristic based on the repeating units cannot be obtained sufficiently. Therefore, it is preferable that a rate of the formula (1) and the formula (2) is 50 mol % or more in relation to the total number of moles of all the repeating units in the polymer.

Concrete examples of the polymer including the repeating unit of the bivalent group represented by the formula (1) or the formula (2) are shown below. However, the first polymer of the embodiment is not limited to the concrete examples shown below. In the following formulas, Me is a methyl group, Et is an ethyl group, Bu is a butyl group, 2-EH is a 2-ethylhexyl group, Hex is a hexyl group, Oct is an octyl group, Hep is a heptyl group, and Ph is a phenyl group.
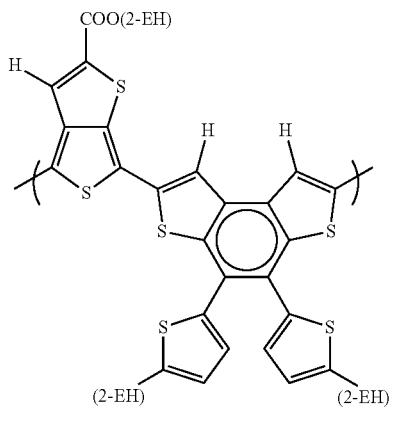
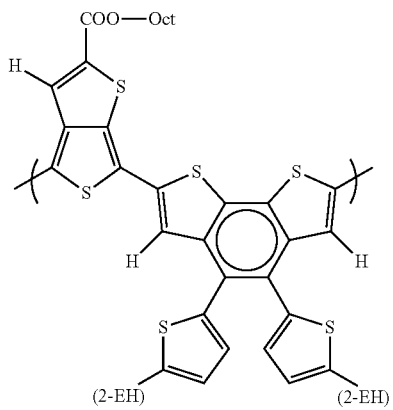
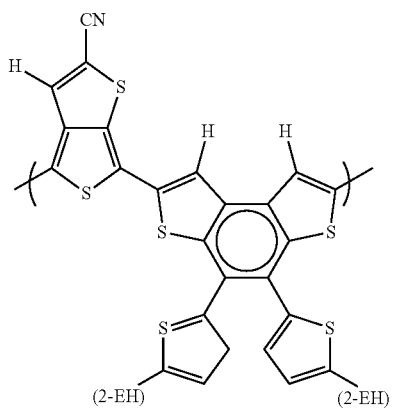
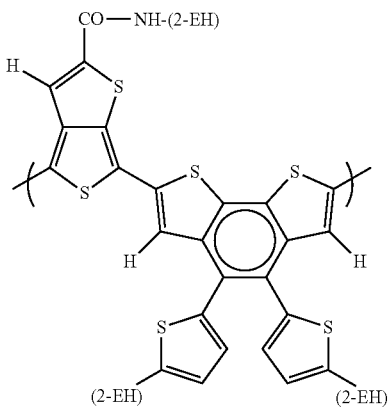
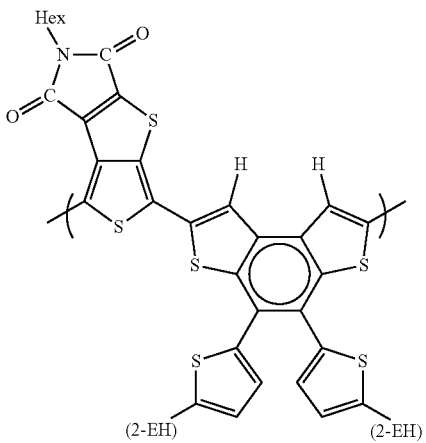
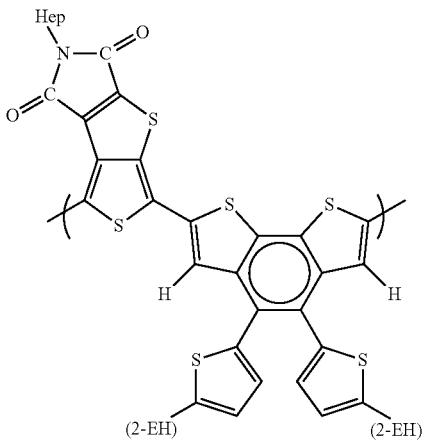
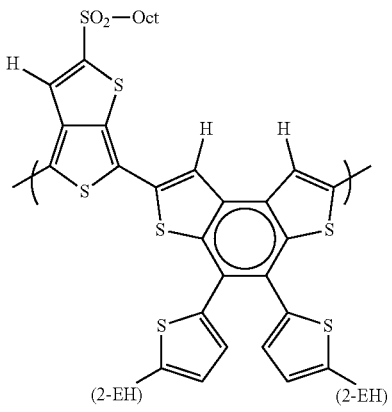

-continued

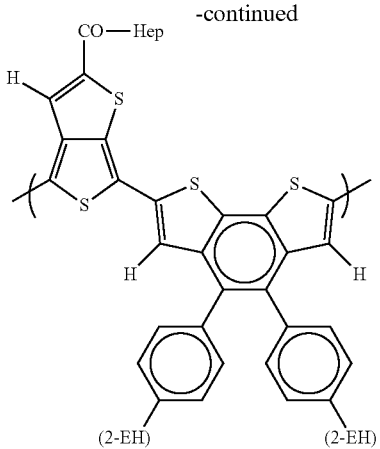

The first polymer preferably includes at least one of a repeating unit represented by the following formula (3) and a repeating unit represented by the following formula (4). According to the polymer including such a repeating unit, it is possible to control an absorption wavelength, and it is possible to improve a short-circuit current density (Jsc) while maintaining a high open circuit voltage (Voc).

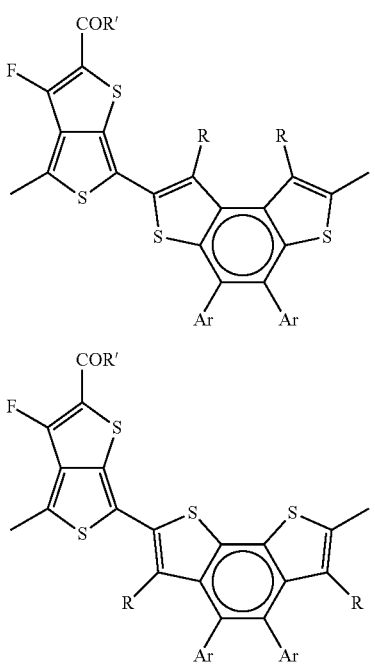

In the formula (3) and the formula (4), R' group is a monovalent group selected from hydrogen, a substituted or unsubstituted alkyl group, a substituted or unsubstituted alkoxy group, a substituted or unsubstituted amino group, a substituted or unsubstituted aryl group, and a substituted or unsubstituted heteroaryl group. In the R' group, the alkyl group, the alkoxy group, the aryl group, and the heteroaryl group are the same as the aforesaid R group. As concrete examples of the substituted or unsubstituted amino group, there can be cited an N-butylamino group, an N-octylamino group, a 5-hexylthienyl group, a 5-butylfuryl group, and so on, but the above groups are not limited to these. Concrete examples of the polymer including the repeating unit represented by the formula (3) or the formula (4) are shown below, but the polymer is not limited to these.

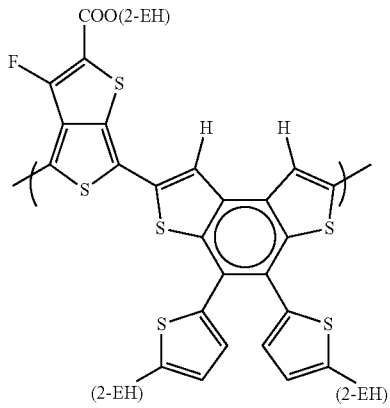

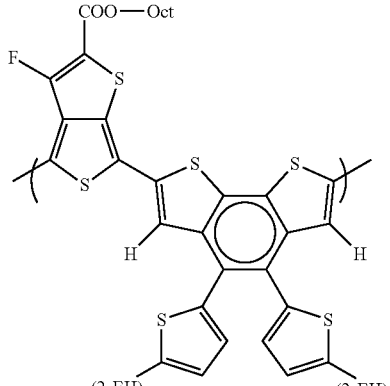

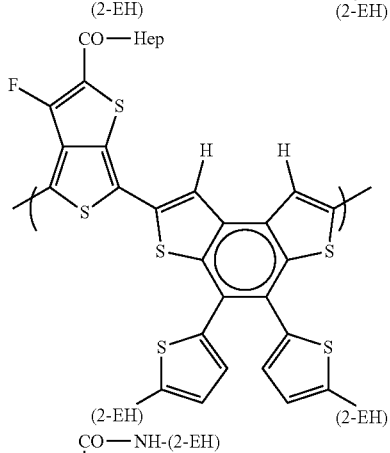

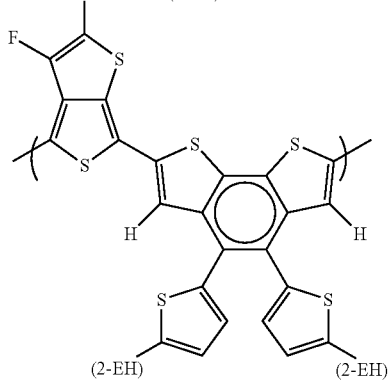

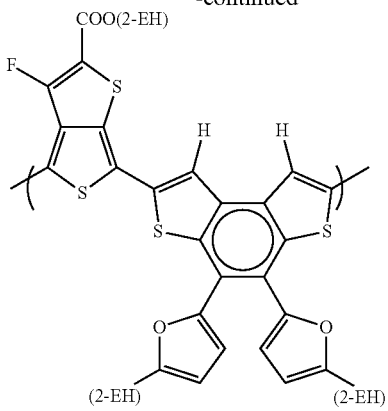
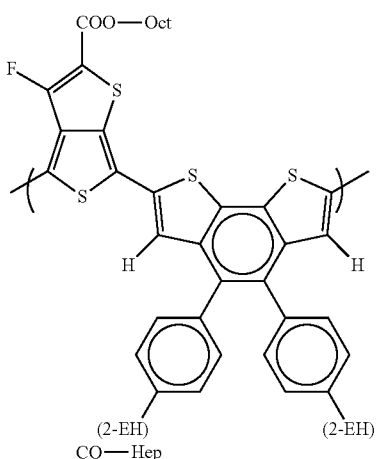
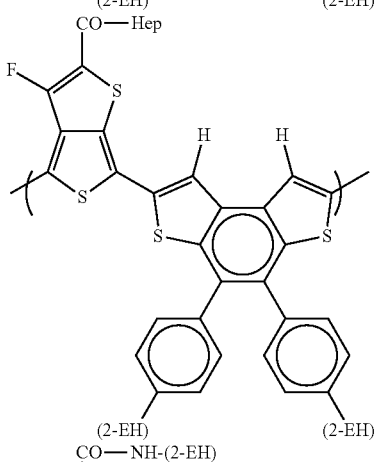
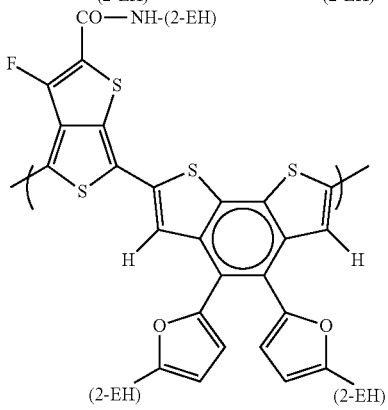

In the first polymer, at least one selected from the R group, the R' group, the X group, the Y group, the Ar group, and the end group Rt may have a cross linking group. By having the cross linking group, the polymer can have improved durability and so on. The first polymer may include a repeating unit not having the cross linking group and a repeating unit having the cross linking group. This also applies to the later-described second polymer.

It suffices that the cross-linking group is a substituent which generates a cross-linking reaction by light, heat, or a radical initiator. For example, as a cross-linking group which generates cross-linking as a result that a bond is resolved by light, there can be cited a substituent which includes an alkyl group or an alkoxy group where substitution is carried out by bromine or iodine, a substituent which includes an azo group or a diazo group, and so on. The cross-linking group may be a substituent which includes a double bond or a triple bond of carbon-carbon that generates photodimerization by light, or a substituent which generates an addition reaction by heat. As such a cross-linking group, there can be exemplified an anthranyl group, a cinnamoyl group, a substituent which includes a coumarin structure, a phenylmaleimide group, a furfurylacrylate group, an acetylene group, a benzocyclobutane group, a cyclopentadienyl group, a substituent having benzocyclobutane or a sultine structure, and so on. Further, the cross-linking group may be a substituent which includes a multiple bond of carbon-carbon, such as an acrylic group and a methacrylic group, as a substituent which reacts with the radical initiator. Concrete examples of the polymer having the cross-linking group are shown below. However, the polymer is not limited to the concrete examples below.

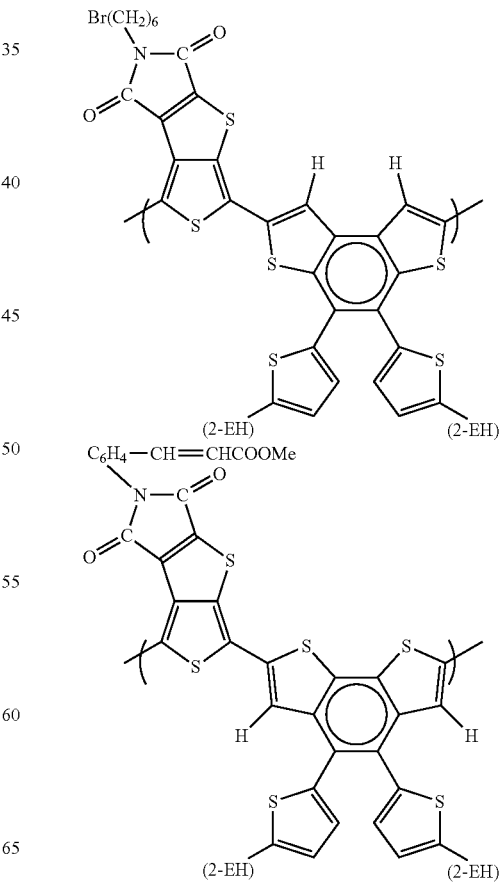

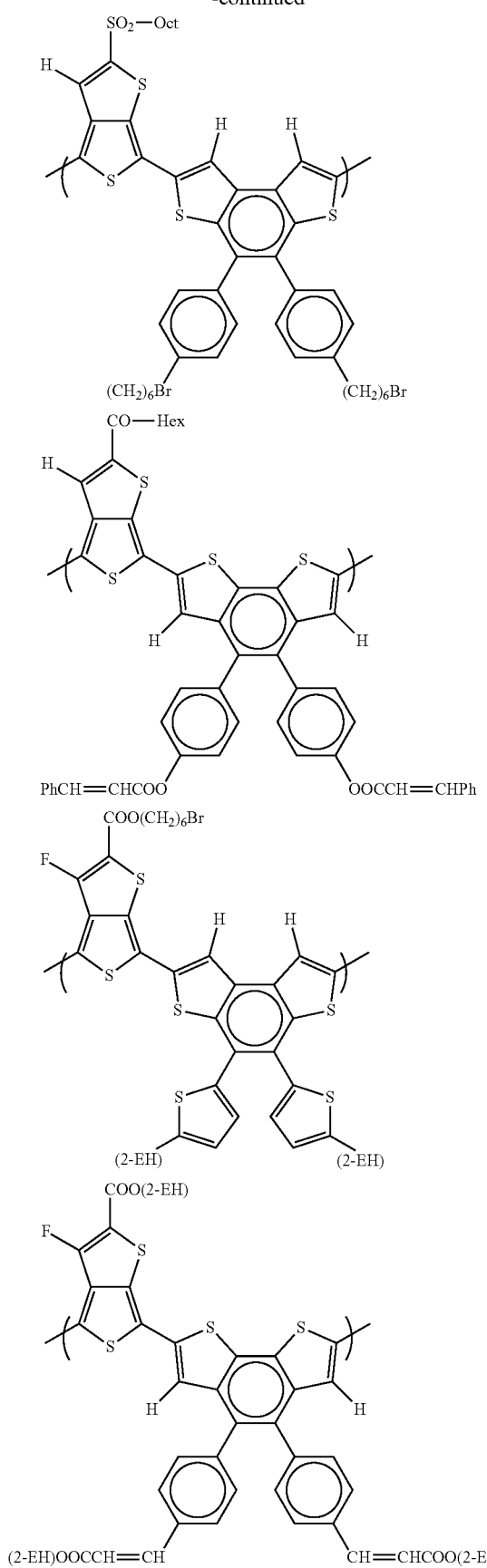
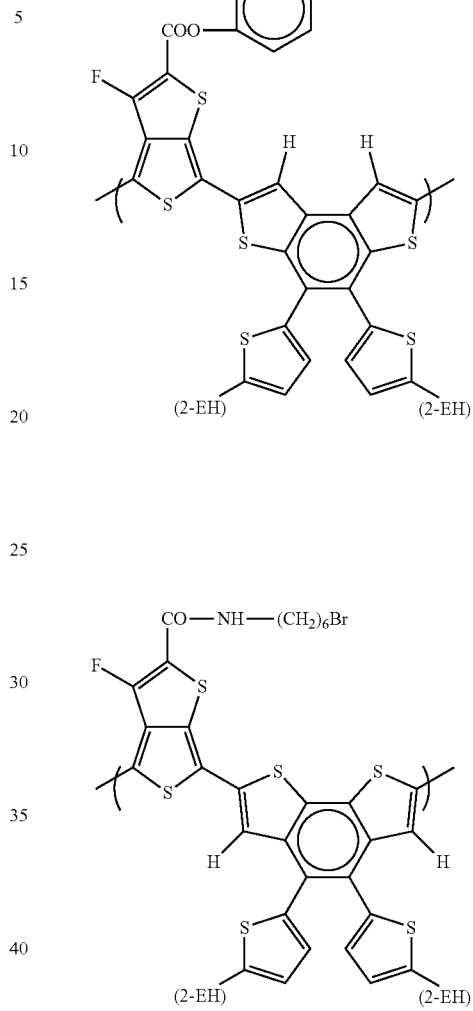
[Second Polymer]
A second polymer in the embodiment is an organic high molecular compound including at least one of a repeating unit represented by the following formula (5) and a repeating unit represented by the following formula (6). A weight-average molecular weight of the second polymer is preferably in a range of 3000 to 1000000.
(5)
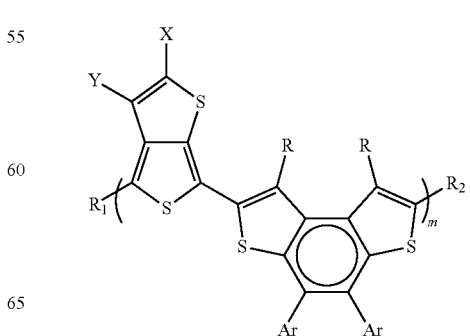

(6)

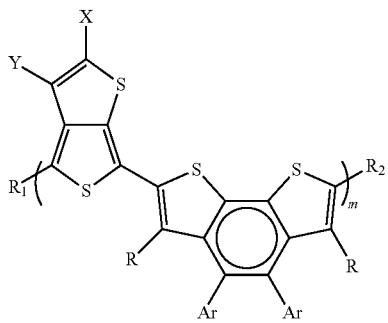

In the formula (5) and the formula (6), R1 group and R2 group are each independently a monovalent group selected from an aryl group having an electron withdrawing group and an awl group having an electron releasing group, and m is a positive number indicating a polymerization degree. As the awl group having the electron withdrawing group, there can be cited a 4-cyanophenyl group, a 4-trifluoromethyl-phenyl group, a 4-nitrophenyl group, a 4-methoxycarbonyl-phenyl group, a 2-(5-cyano)thienyl group, and so on, but the above awl group is not limited to these. As the awl group having the electron releasing group, there can be cited a 4-methoxyphenyl group, an N,N-dimethylaminophenyl group, a tolyl group, a 2-(5-octyl)thienyl group, and so on, but the above aryl group is not limited to these.

In the formula (5) and the formula (6), the R group, the X group, the Y group, and the Ar group are each the same substituent or atom as that in the formula (1) and the formula (2) and their concrete examples are also the same, In the repeating units represented by the formula (5) and the formula (6), the same parts as those in the formula (1) and the formula (2) are as described in the first polymer. Further, a polymerization degree and so on are also as described in the first polymer. Concrete examples of the polymer including the repeating unit represented by the formula (5) or the formula (6) are shown below, but they are not limited thereto.

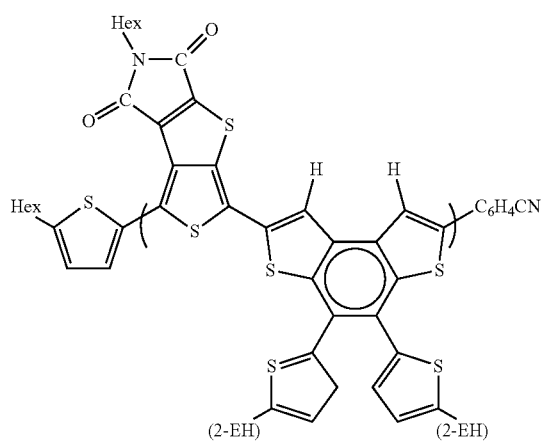

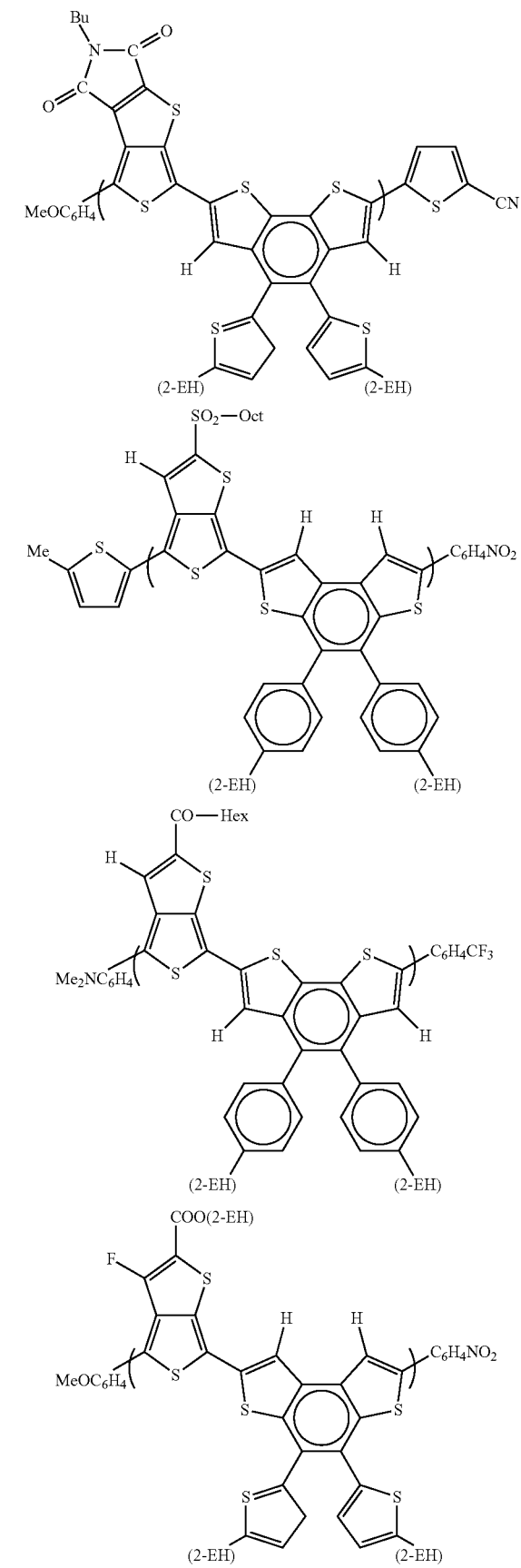

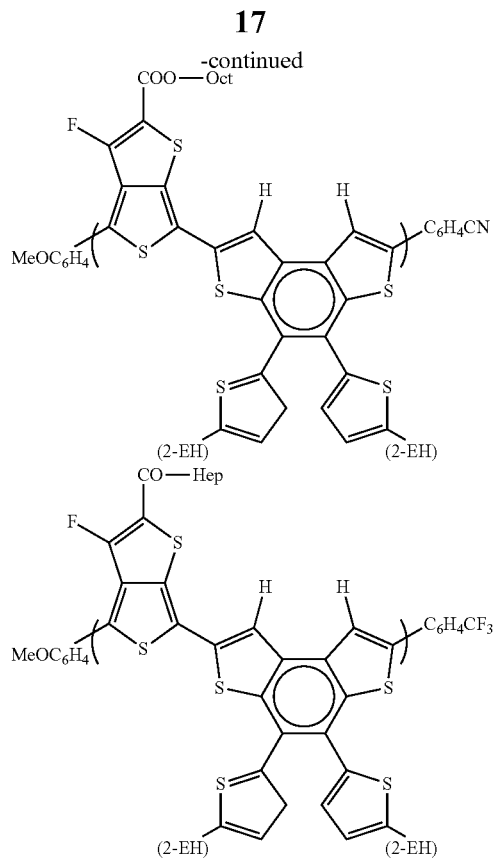

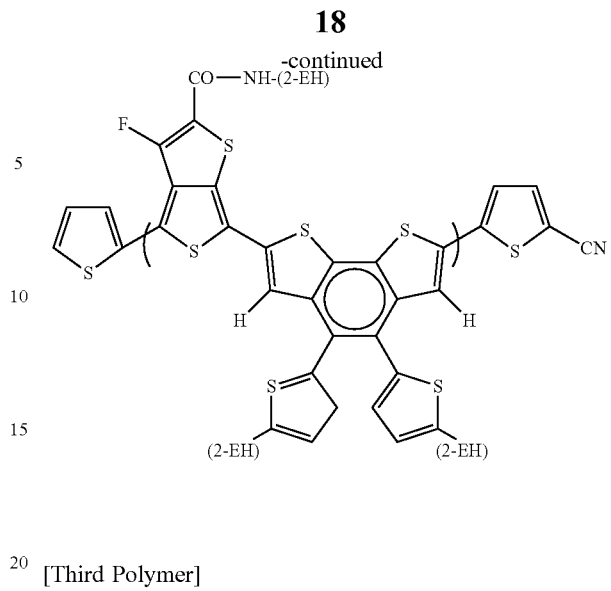

[Third Polymer]

A third polymer in the embodiment is an organic high molecular compound including a structure represented by the following formula (7) or the following formula (8), or an organic high molecular compound including a structure represented by the following formula (9) or the following formula (10). A weight-average molecular weight of the third polymer is preferably in a range of 3000 to 1000000.

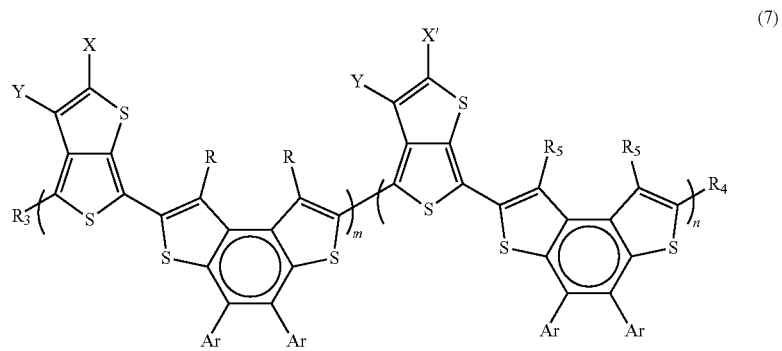

(7)

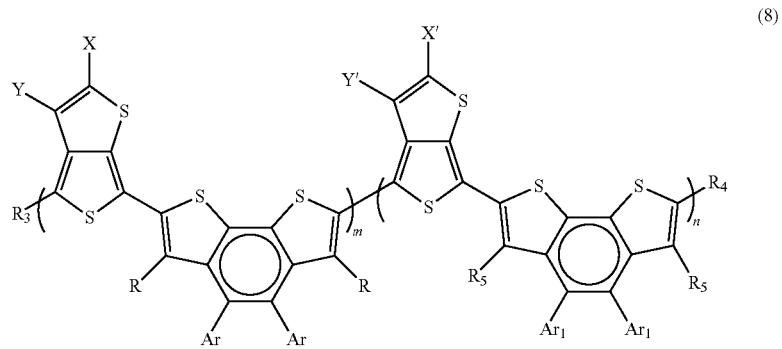

(8)

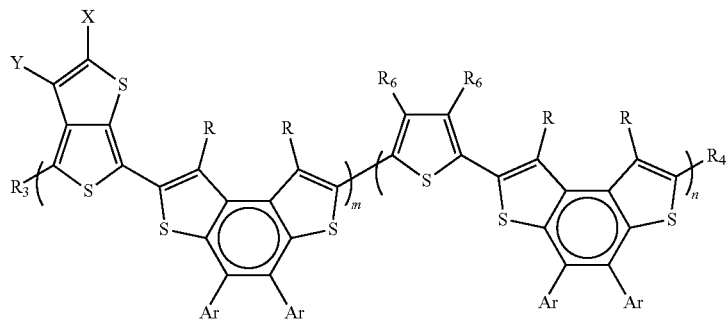

(9)

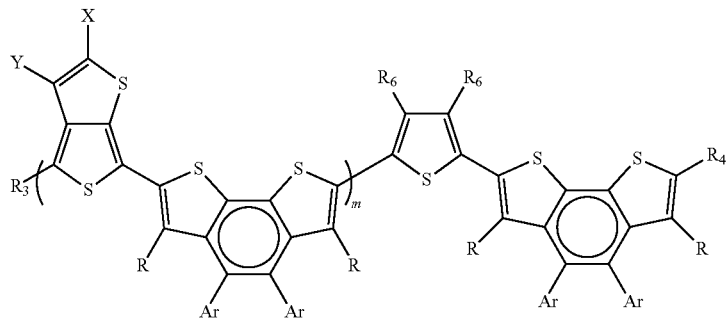

(10)

In the formula (7) and the formula (8), at least one of R5 group and Ar1 group is a substituent having a cross-linking group. In the formula (9) and the formula (10), at least one of R6 groups is a substituent having a cross linking group. The cross linking group is as described in the first polymer. By having the cross-linking group, the polymer can have improved durability and so on. Note that the R5 group not having the cross-linking group is the same as the R group, and the Ar1 group not having the cross linking group is the same as the Ar group. The X' group and the Y' group are the same as the X group and the Y group, and their concrete structures, that they may form a condensed ring, and so on are also the same as with the X group and the Y group. The m and n are each a positive number indicating a polymerization degree, and are numbers satisfying $0.01 \leq n/(n+m) \leq 0.5$.

In the formula (7) to the formula (10), the R group, the X group, the Y group, and the Ar group are each the same substituent or atom as that in the formula (1) and the formula (2) and their concrete examples are also the same In the structures represented by the formula (7) to the formula (10), the same parts as those in the formula (1) and the formula (2) are as described in the first polymer. Further, the polymerization degree and so on of the polymer are also as described in the first polymer. Concrete examples of the polymer including the structure represented by any of the formula (7) to the formula (10) are shown below, but the polymer is not limited to these.

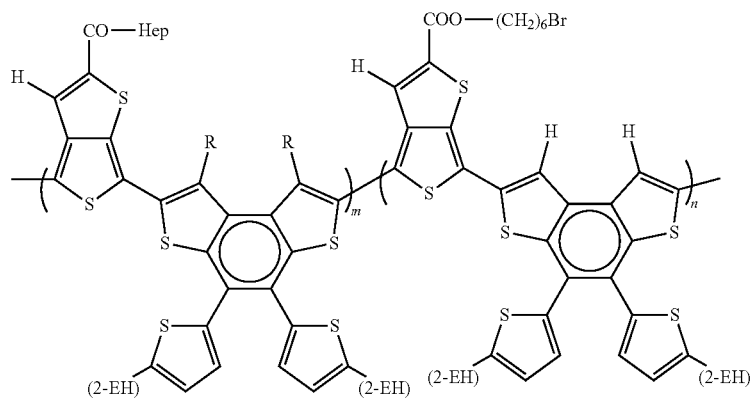

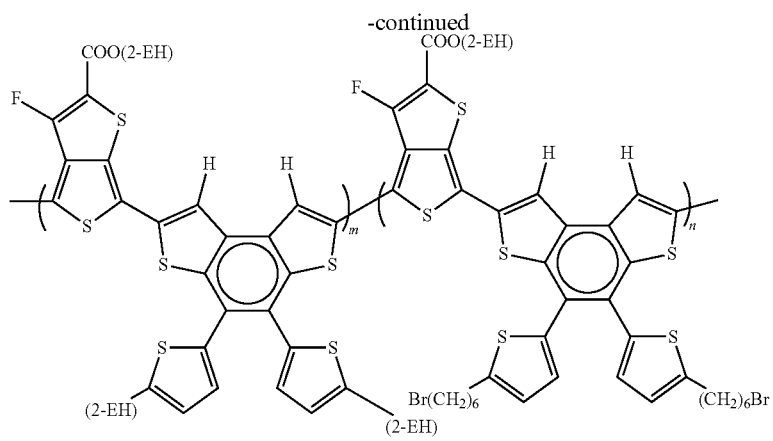
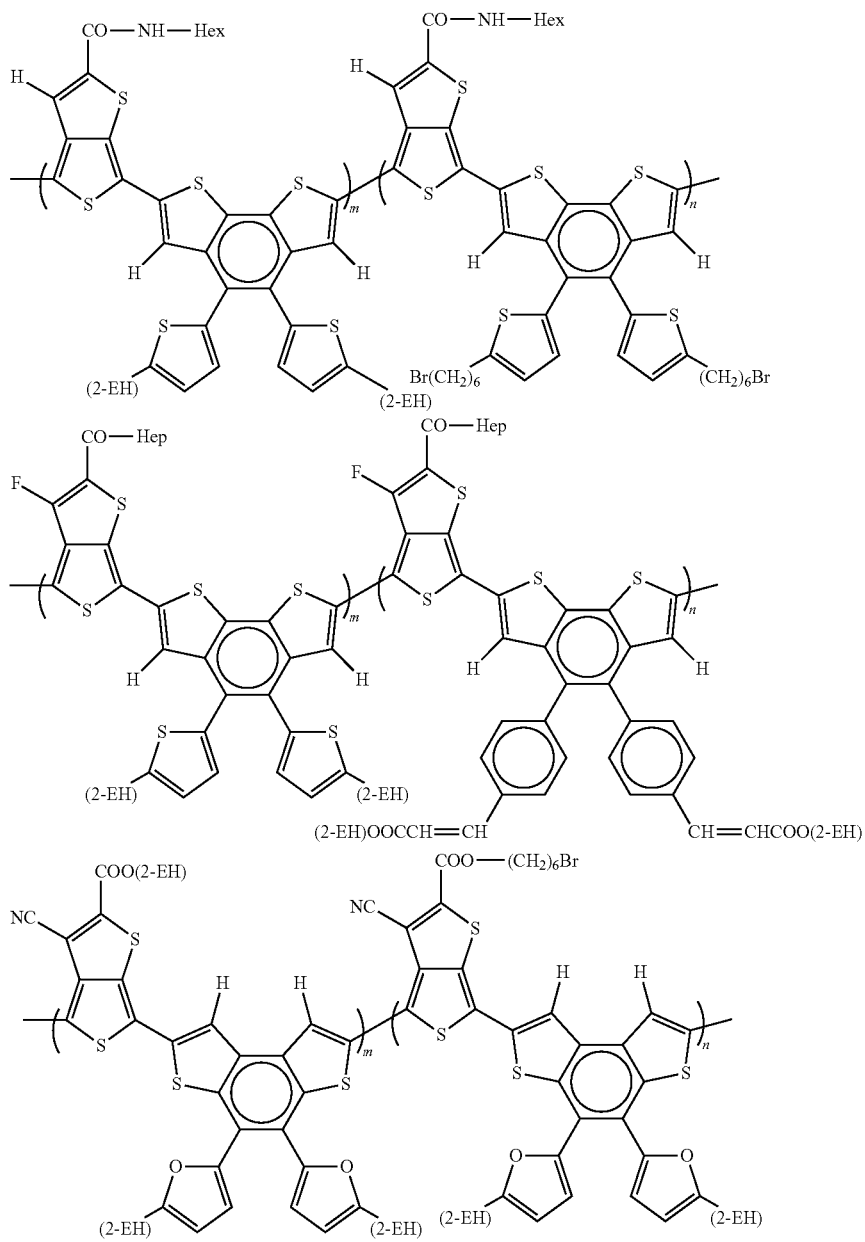

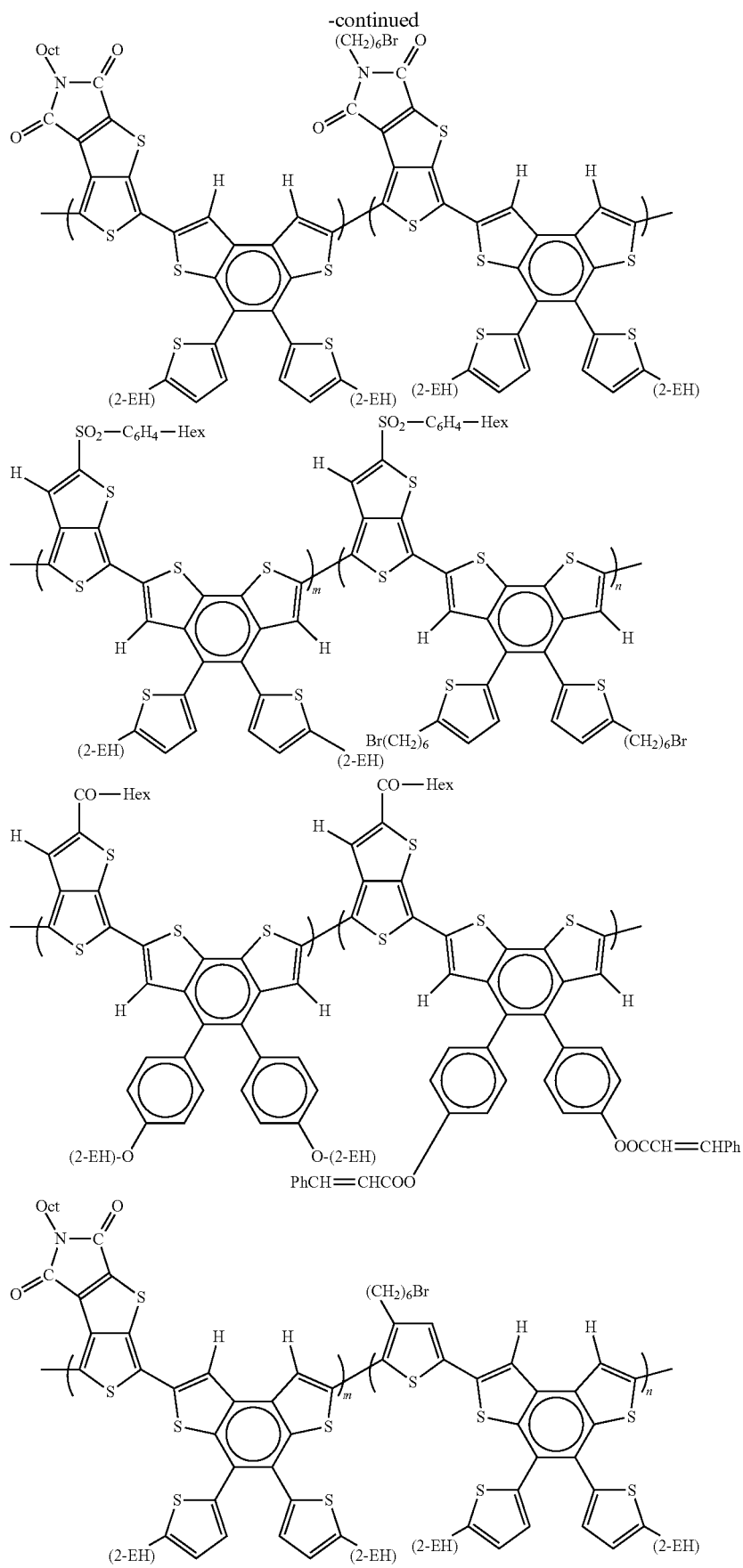

-continued

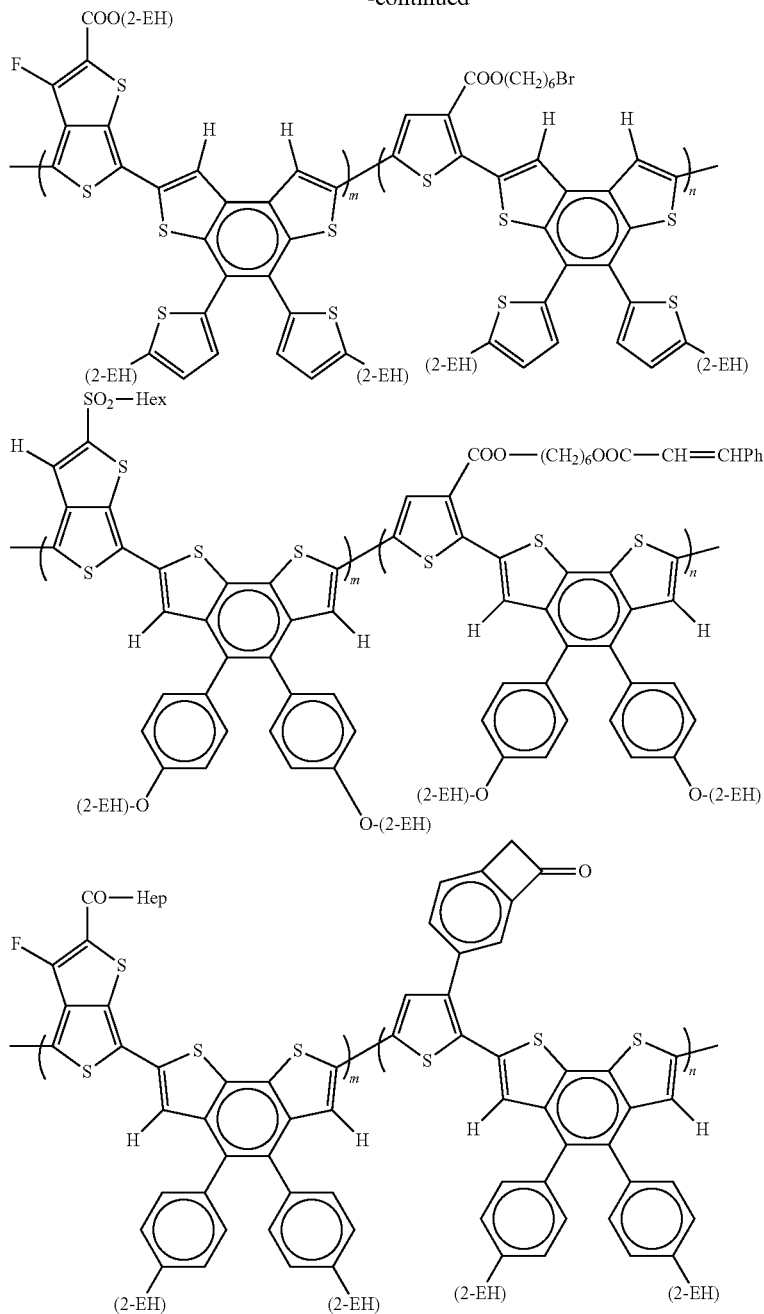

[Method for Synthesizing Organic High Molecular Compound]

A method for synthesizing the polymer of the embodiment is not limited in particular. The polymer of the embodiment can be synthesized as a result that, for example, after monomers having functional groups suitable for a polymerization reaction to be used are synthesized, the monomers are dissolved in an organic solvent as necessary and polymerized by using a known aryl coupling reaction in which alkali, a catalyst, a ligand, and so on are used. As a polymerization method by the aryl coupling reaction, there can be cited a polymerization method by a Stille coupling reaction or a Suzuki coupling reaction, for instance.

The polymerization by the Stille coupling is a method in which a palladium complex is used as the catalyst and the ligand is added as necessary, and a monomer that has a trialkyltin residue is made to react with a monomer that has a halogen atom such as a bromine atom, an iodine atom, and a chlorine atom. As the palladium complex, there can be cited palladium[tetrakis(triphenylphosphine)], [tris(dibenzylideneacetone)]dipalladium, palladiumacetate, and bis(triphenylphosphine)palladiumdichloride, for example. Details of the polymerization by the Stille coupling reaction is described in International Publication No. 2010/008672, for example. As the solvent used in the Stille coupling reaction, an organic solvent such as toluene, xylene, N,N-dimethylacetamide, N,N-dimethylformamide, and a mixed solvent made by mixing two or more kinds of the above is used, for instance. However, the solvent used in the Stille coupling reaction is not limited to these. In order to suppress a side reaction, it is preferable that the solvent used in the Stille coupling reaction is subjected to deoxidization processing before the reaction.

The polymerization by the Suzuki coupling reaction is a method in which, under existence of an inorganic base or an organic base, a palladium complex or a nickel complex is used as the catalyst, the ligand is added as necessary, and a monomer that has a boronic acid residue or a boric acid ester residue is made to react with a monomer that has a halogen atom such as a bromine atom, an iodine atom, and a chlorine atom, or a monomer that has a sulfonate group such as a trifluoromethanesulfonate group and a p-toluenesulfonate group.

As the inorganic base, there can be cited a sodium carbonate, a potassium carbonate, a cesium carbonate, a tripotassium phosphate, and a potassium fluoride, for example. As the organic base, there can be cited a tetrabutylammonium fluoride, a tetrabutylammonium chloride, a tetrabutylammonium bromide, and a tetraethylammonium hydroxide, for example. As the palladium complex, there can be cited palladium[tetrakis(triphenylphosphine)], [tris (dibenzylideneacetone)]dipalladium, palladiumacetate, and bis(triphenylphosphine)palladiumdichloride, for example. As the nickel complex, bis(cyclooctadiene)nickel, for example, can be cited. As the ligand, there can be cited triphenylphosphine, tri(2-methylphenyl)phosphine, tri(2-methoxyphenyl)phosphine, diphenylphosphinopropane, tri (cyclohexyl)phosphine, and tri(tert-butyl)phosphine, for example. Details of the polymerization by the Suzuki coupling reaction is described in Journal of Polymer Science: Part A: Polymer Chemistry, Vol. 39, p 1533-1, 2001, for example.

In the polymerization by the aryl coupling reaction, a normal solvent is used. It suffices that the solvent is selected in consideration of a polymerization reaction to be used and solubilities of the monomers and the polymer. Concretely, there can be cited an organic solvent such as tetrahydrofuran, toluene, 1,4-dioxane, dimethoxyethane, N,N-dimethylacetamide, N,N-dimethylformamide, and a mixed solvent made by mixing two or more kinds of the above, or a solvent having two phases of an organic solvent phase and an aqueous phase. In the Suzuki coupling reaction, it is preferable to use an organic solvent such as tetrahydrofuran, toluene, 1,4-dioxane, dimethoxyethane, N,N-dimethylacetamide, N,N-dimethylformamide, and a mixed solvent made by mixing two or more kinds of the above, or a solvent having two phases of an organic solvent phase and an aqueous phase. In order to suppress a side reaction, it is preferable that the solvent used in the Suzuki coupling reaction is subjected to deoxidization processing before the reaction.

In view of reactivity, a reaction temperature of the aryl coupling reaction is preferable to be −100° C. or more, more preferable to be −20° C. or more, and particularly preferable to be 0° C. or more. In view of stability of the monomers and the high molecular compound, the reaction temperature is preferable to be 200° C. or less, more preferable to be 150° C. or less, and particularly preferable to be 120° C. or less. In the polymerization by the aryl coupling reaction, a known method can be applied to extraction of the polymer from a reaction solution after the reaction. For example, the polymer of the embodiment can be obtained as a result that the reaction solution is added to a lower alcohol such as methanol, that a precipitated deposit is filtered, and that a filtered material is dried. When purity of the obtained polymer is low, the polymer may be refined by recrystallization, continuous extraction by a Soxhlet extractor, column chromatography, or the like.

The polymer of the embodiment can be synthesized by using the Stille coupling reaction. For example, the polymer is synthesized by polymerizing bis(trialkyl)tin represented by a formula (11) or a formula (12) with a dihalogen compound represented by a formula (13). In the following formulas, the R group, the X group, the Y group, and the Ar group are as previously described. L is a halogen atom selected from fluorine, chlorine, bromine, and iodine. R″ is, for example, an alkyl group such as a methyl group, an ethyl group, a propyl group, a butyl group, or an octyl group.

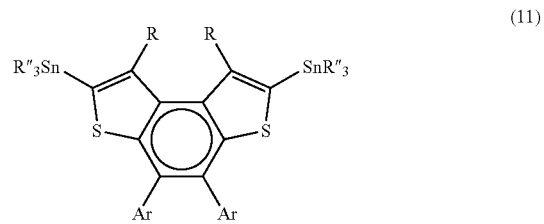

(11)

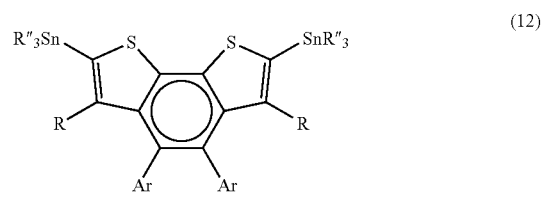

(12)

(13)

Concrete examples of the compound represented by the formula (11) or the formula (12) are shown below. However, the compound is not limited to the following concrete examples.

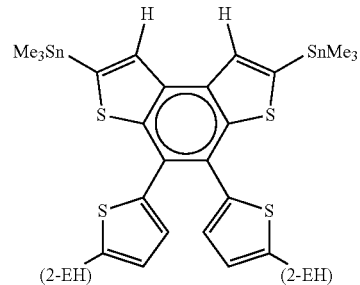

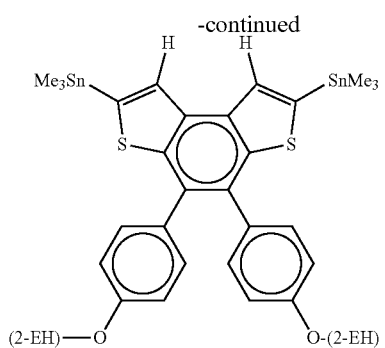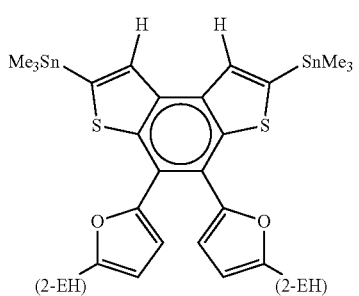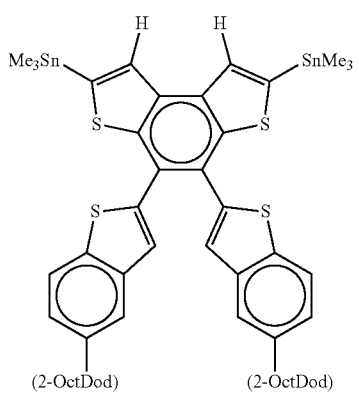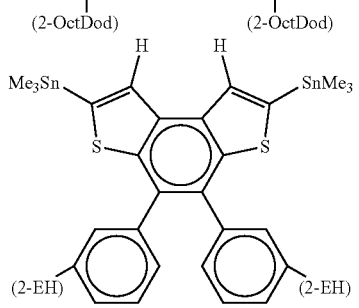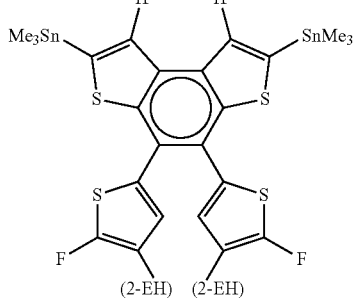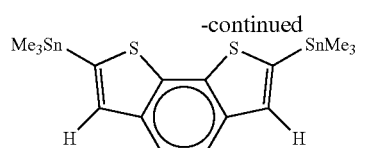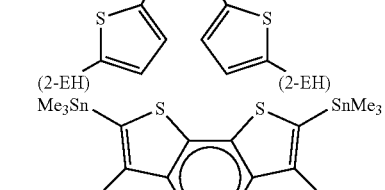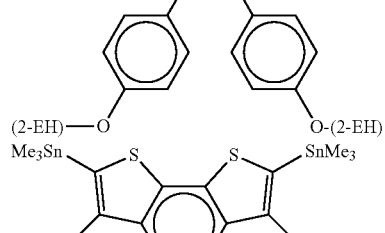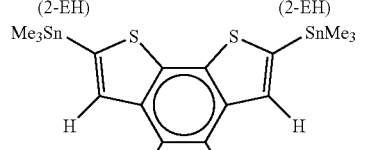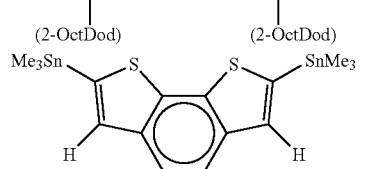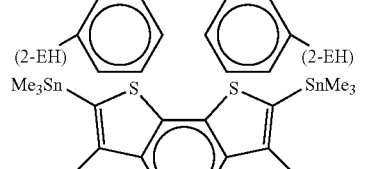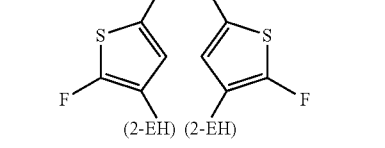
Concrete examples of the compound represented by the formula (13) are shown below. However, the compound is not limited to the following concrete examples.

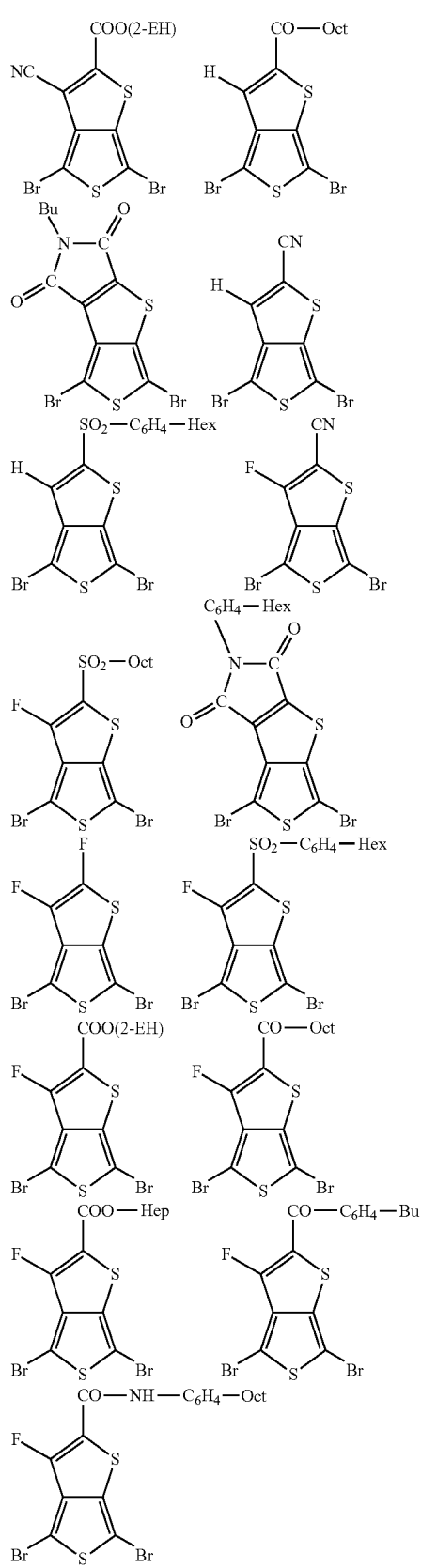
The polymer of the embodiment may have the previously described cross-linking group. In such a case, the polymer is synthesized by using a compound having the cross-linking group. Concrete examples of the compound having the cross-linking group are shown below. However, the compound is not limited to the following concrete examples.
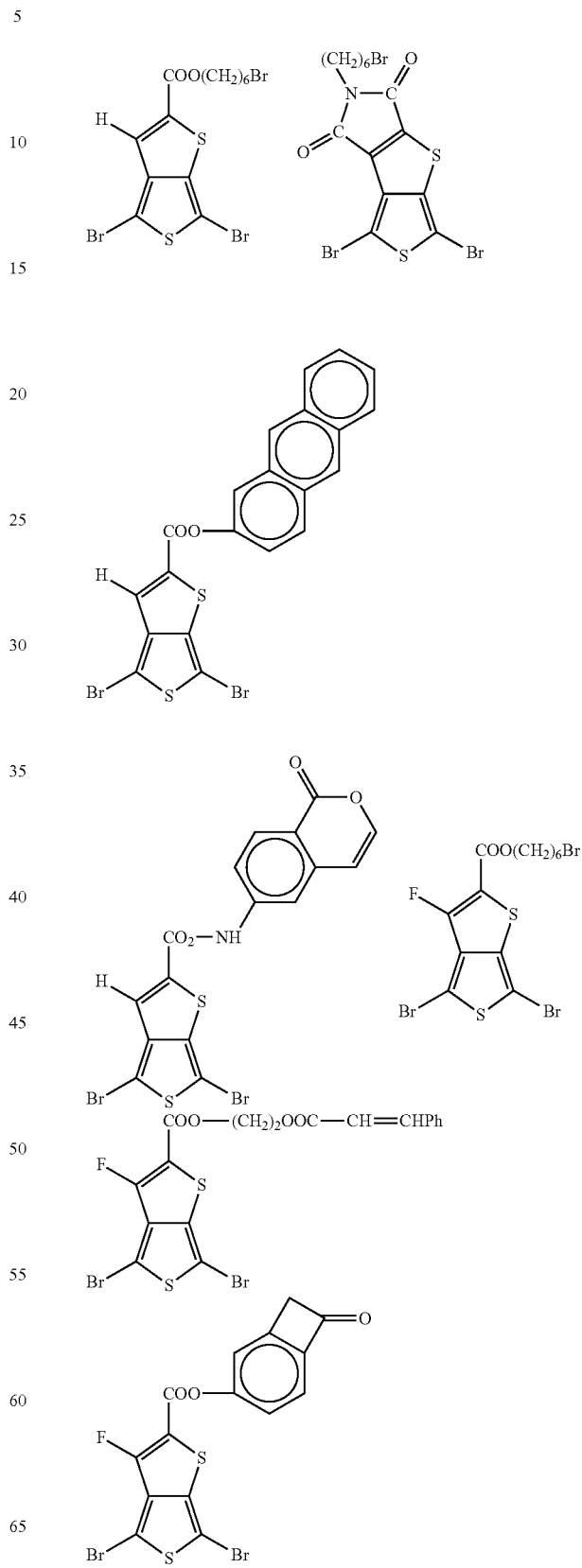

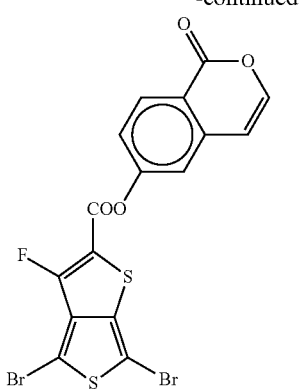
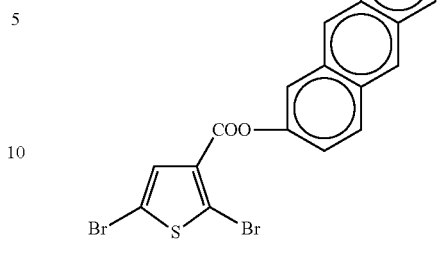
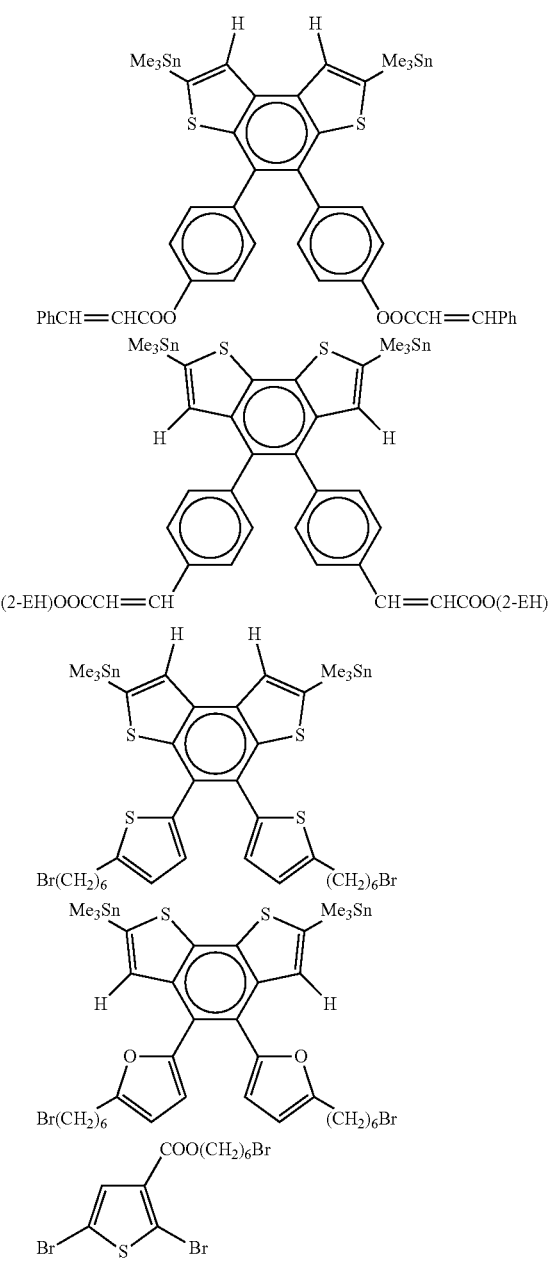

The polymer of the embodiment can be synthesized by using the Suzuki coupling reaction. The polymer is synthesized by polymerizing, for example, a compound represented a formula (14) and a compound represented by a formula (15). In the following formulas, Q is a boric acid ester residue and means a group which is boric acid diester from which a hydroxy group is removed. Concrete examples of the Q group are shown below but the Q group is not limited to these.

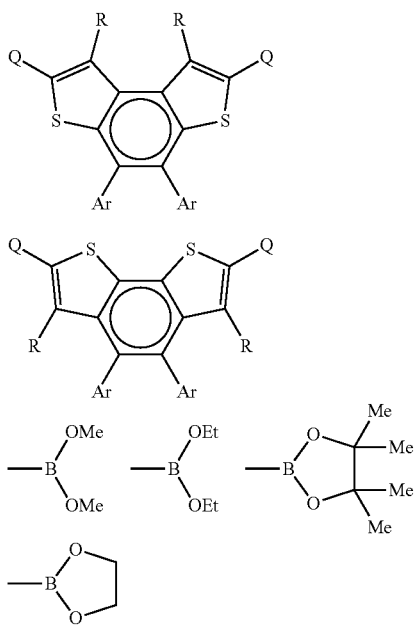

[Solar Cell]

A solar cell of an embodiment includes a photoelectric conversion element which has a pair of electrodes and a photoelectric conversion layer disposed therebetween and containing an organic material. As layers containing the organic material out of layers forming the photoelectric conversion layer, an active layer, a buffer layer, and so on can be cited. As the active layer containing the organic material, for example, a layer having a p-type semiconductor material (electron donor) containing the aforesaid polymer of the embodiment and an n-type semiconductor material (electron acceptor) can be cited. The photoelectric conversion element including the photoelectric conversion layer containing such an organic material is applicable not only to a solar cell but also to a photosensor and a light emitting element.

[Organic Thin Film Solar Cell]

The solar cell of the embodiment will be described with reference to FIG. 1. A solar cell element 100 shown in FIG. 1 has a substrate 110, a first electrode 120, a photoelectric conversion layer 130, and a second electrode 140. FIG. 1 shows a solar cell element (photoelectric conversion element) used for a normal organic thin film solar cell, but a structure of the solar cell element is not limited thereto. The photoelectric conversion layer 130 has a first buffer layer 131, an active layer 132, and a second buffer layer 133. The buffer layers 131, 133 are disposed when necessary. The first electrode 120 is an electrode (hereinafter, sometimes referred to as a cathode) to collect an electron. The second electrode 140 is an electrode (hereinafter, sometimes referred to as an anode) to collect a hole. In FIG. 1, the cathode 120 is disposed on a substrate 110 side, but the cathode 120 and the anode 140 can be reversed. These parts will be described.

<Active Layer (132)>

The active layer 132 in the solar cell element 100 of the embodiment includes the p-type semiconductor material (electron donor) and the n-type semiconductor material (electron acceptor). The p-type semiconductor material has the aforesaid polymer of the embodiment. A concrete configuration of the polymer as the p-type semiconductor material is as described above. The n-type semiconductor material (electron acceptor) will be described below. The active layer 132 may include a plurality of kinds of p-type semiconductor materials and a plurality of kinds of n-type semiconductor materials.

<n-Type Semiconductor Material>

As the n-type semiconductor material (electron acceptor) included in the active layer 132, there can be cited a phthalocyanine derivative, a fullerene or a fullerene derivative, a boron-containing polymer, poly(benzobisimidazobenzophenanthroline), and so on, but the n-type semiconductor material included in the active layer 140 is not limited thereto. Among the above, the fullerene derivative is preferable. As concrete examples of the fullerene derivative, there can be cited 1',1'',4'4''-Tetrahydro-di[1,4]methanonaphthaleno[1,2:2',3',56,60:2'',3''][5,6]fullerene-C60(indene-$C_{60}$bis adduct: IC60BA), [6,6]-Phenyl C61 butyric acid methyl ester (PC60BM), [6,6]-Phenyl C71 butyric acid methyl ester (PC70BM), Dihyrdonaphtyl-based[60]fullerene bisadducts (NC60BA), Dihyrdonaphtyl-based[70]fullerene bisadducts (NC70BA), and so on, but the fullerene derivative is not limited thereto.

<Configuration and Structure of Active Layer>

In order to transfer an electron from the electron donor (p-type semiconductor) to the electron acceptor (n-type semiconductor) efficiently, a relativity between LUMO energy levels of the p-type semiconductor material and the n-type semiconductor material is important. Concretely, it is preferable that the LUMO energy level of the p-type semiconductor material is higher than the LUMO energy level of the n-type semiconductor material by a predetermined energy. In other words, it is preferable that electron affinity of the p-type semiconductor material is larger than electron affinity of the n-type semiconductor material by the predetermined energy.

If the LUMO energy level of the n-type semiconductor material is too high, the transfer of the electron is hard to occur, and thus a short-circuit current (Jsc) of the solar cell element 100 tends to become low. On the other hand, an open circuit voltage (Voc) of the solar cell element 100 is determined by a difference between a HOMO energy level of the p-type semiconductor material and the LUMO energy level of the n-type semiconductor material. Therefore, if the LUMO energy level of the n-type semiconductor material is too low, the Voc tends to become low. That is, in order to realize higher conversion efficiency, it is not enough to simply select the n-type semiconductor material whose LUMO energy level is high or whose LUMO energy level is low.

It is possible to adjust the LUMO energy level of the aforementioned second polymer of the embodiment by selecting its substituent. That is, as a result of changing substituents of two kind of monomers constituting a copolymer, compounds having various energy levels can be obtained. In order to obtain the monomers having various substituents, a known technique such as esterification, etherification, and cross-coupling, for example, can be used. However, a suitable combination of the p-type semiconductor material and the n-type semiconductor material is not simply determined only based on the LUMO energy level and the HOMO energy level.

In the solar cell element 100, light is absorbed by the active layer 132, charge separation occurs in an interface between the p-type semiconductor and the n-type semiconductor, and an electron and a hole which have been generated are extracted from the electrodes 120, 140. A thickness of the active layer 132 is not limited in particular, but the thickness of the active layer 132 is preferable to be from 10 nm to 1000 nm, and is further preferable to be from 50 nm to 250 nm. By setting the thickness of the active layer 132 to 10 nm or more, uniformity of the layer is maintained and a short circuit becomes hard to occur. By setting the thickness of the active layer 132 to 1000 nm or less, an internal resistance can be made small, and as a result that a distance between the electrodes 120, 140 becomes closer, diffusion of electric charges are made better.

As concrete structures of the active layer 132, there can be cited a thin film laminated type in which a p-type semiconductor layer and an n-type semiconductor layer are laminated, and a bulk hetero junction type in which a p-type semiconductor material and an n-type semiconductor material are mixed. The active layer 132 of the thin film laminated type may have a layer (i layer) which is disposed between the p-type semiconductor layer and the n-type semiconductor layer and in which the p-type semiconductor material and the n-type semiconductor material are mixed. It is preferable that the solar cell element 100 of the embodiment has the active layer 132 including the bulk hetero junction structure in which the p-type semiconductor material and the n-type semiconductor material are mixed.

The bulk hetero junction type active layer 132 includes the p-type semiconductor material and the n-type semiconductor material. In the active layer 132, a p-type semiconductor phase and an n-type semiconductor phase are phase-separated from each other. When the active layer 132 absorbs light, a negative charge (electron) and a positive charge (hole) are separated in the interface of these phases and transported to the electrodes 120, 140 through the respective semiconductors. In the bulk hetero junction type active layer 132, the phase separation structure of the p-type semiconductor phase and the n-type semiconductor phase affects a light absorption process, a diffusion process of excitons, a dissociation process of the excitons (charge generation process), a carrier transportation process, and so on. Therefore, in order to heighten photoelectric conversion efficiency of the solar cell element 100, it is preferable to make the phase separation structure of the p-type semiconductor phase and the n-type semiconductor phase in the active layer 132 appropriate.

<Forming Method of Active Layer>

A forming method of the active layer 132 is not limited in particular, but it is preferable to apply a wet coating method such as a spin coat method, an ink-jet method, a doctor blade method, and a drop casting method. In this case, a solvent is selected in which the p-type semiconductor material (the aforesaid polymer of the embodiment) and the n-type semiconductor material are soluble, and a coating solution which includes the p-type semiconductor material made of the polymer and the n-type semiconductor material is fabricated. By applying this coating solution, the bulk hetero junction type active layer 132 can be formed.

A kind of the solvent is not limited in particular as long as the semiconductor materials can be dissolved in the solvent uniformly. The solvent can be selected, for example, from aliphatic hydrocarbons such as hexane, heptane, octane, isooctane, nonane, and decane, aromatic hydrocarbons such as toluene, xylene, chlorobenzene, and orthodichlorobenzene, low alcohols such as methanol, ethanol, and propanol, ketones such as acetone, methyl ethyl ketone, cyclopentanone, and cyclohexanone, esters such as ethyl acetate, butyl acetate, and methyl lactate, halogen hydrocarbons such as chloroform, methylene chloride, dichloroethane, trichloroethane, and trichloroethylene, ethers such as ethyl ether, tetrahydrofuran, and dioxane, amides such as dimethylformamide and dimethylacetamide, and so on.

<Additive to Active Layer Coating Solution>

In a case where the bulk hetero junction type active layer 132 is to be formed by the coating method, addition of a compound with a low molecular weight to the coating solution sometimes improves photoelectric conversion efficiency. As a mechanism where the additive optimizes the phase separation structure and improves the photoelectric conversion efficiency, a plurality of causes can be considered. As one of the causes, it is considered that existence of the additive suppresses aggregation of the p-type semiconductor materials to each other or of the n-type semiconductor materials to each other. In other words, without the additive, the solvent of the active layer coating solution (ink) normally volatilizes immediately after the coating. It is considered that the p-type semiconductor material and the n-type semiconductor material which remain as residual components on this occasion each form a large aggregate. In such a case, a joint area (area of the interface) between the p-type semiconductor material and the n-type semiconductor material becomes small, and charge generation efficiency is lowered.

When the ink which includes the additive is applied, the additive remains for a while after the volatilization of the solvent. In other words, since the additive exists in the p-type semiconductor material or in the n-type semiconductor material, or in peripheries of the both, the aggregation of the p-type semiconductor material and/or the n-type semiconductor material is prevented. It is considered that the additive evaporates at a low speed under a room temperature and a normal pressure after the application of the ink. The p-type semiconductor material and the n-type semiconductor material are considered to aggregate as the additive evaporates, but since the remaining additive prevents the aggregation, the aggregates which the p-type semiconductor material and the n-type semiconductor material form are smaller. Consequently, in the active layer 132, a phase separation structure is formed in which the joint area of the p-type semiconductor material and the n-type semiconductor material is large and which has higher charge generation efficiency.

As described above, it is preferable that the additive remains in the active layer 132 for a while after the volatilization of the main solvent of the ink. From such a viewpoint, it is preferable that a boiling point of the additive is higher than that of the main solvent of the ink. Since boiling points of chlorobenzene and orthodichlorobenzene, which are often used as main solvents of ink, are 131° C. and 181° C., respectively, it is preferable that the boiling point of the additive under the normal pressure (1000 hPa) is higher than the above. From a similar viewpoint, it is preferable that a vapor pressure of the additive is lower than a vapor pressure of the main solvent of the ink under the room temperature (25° C.). If the boiling point of the additive is too high, the additive does not disappear completely from the active layer 132 after fabrication of the element, and it is supposed that an amount of the additive remaining in the active layer 132 increases. In such a case, it is considered that increase of impurities causes reduction of mobility, that is, reduction of the photoelectric conversion efficiency. Therefore, it can also be said that the boiling point of the additive is preferably not too high.

The boiling point of the additive under the normal pressure is preferable to be higher than the boiling point of the main solvent by a range of 10° C. or more to 200° C. or less, and further, is more preferable to be higher than the boiling point of the main solvent by a range of 50° C. or more to 100° C. or less. If the boiling point of the additive is too low, the aggregation of the n-type semiconductor material is apt to occur at a time of drying of the ink. Consequently, morphology of the active layer 132 becomes large, and there is a possibility that a surface becomes uneven. It is preferable that the additive is liquid under the room temperature (25° C.), in view of facilitating ink fabrication. If the additive is solid under the room temperature, it is considered that dissolving the additive in the main solvent at the time of the ink fabrication is difficult or that a long stirring time is required even if the additive can be dissolved. In order to optimize the phase separation structure of the active layer 132, not only the boiling point of the additive but also compatibility of the additive with the p-type semiconductor material and the n-type semiconductor material is important. In other words, since the additive interacts with the p-type semiconductor material and the n-type semiconductor material, there is a possibility that crystallinity or the like of the p-type semiconductor material or the n-type semiconductor material changes depending on a structure of the additive, for example.

As concrete examples of the additive, there can be cited an aromatic compound such as alkane having a substituent and naphthalene having a substituent. As the substituent, there can be cited an aldehyde group, an oxo group, a hydroxy group, an alkoxy group, a thiol group, a thioalkyl group, a carboxyl group, an ester group, an amine group, an amide group, a fluoro group, a chloro group, a bromo group, an iodine group, a nitrille group, an epoxy group, an aryl group, and so on. The substituent may be single or may be plural. As the substituent which the alkane has, the thiol group or the iodine group is preferable. As the substituent which the aromatic compound such as the naphthalene has, the bromo group or the chloro group is preferable. Since it is preferable that the additive has the high boiling point as described above, a carbon number of the alkane is preferable to be 6 or more, and is more preferable to be 8 or more. Since it is preferable that the additive is liquid under the room temperature as described above, the carbon number of the alkane is preferable to be 14 or less and further preferable to be 12 or less.

It is preferable that an amount of the additive included in the ink (active layer coating solution) is 0.1 wt % or more to 10 wt % or less in relation to the entire ink. Further, it is more preferable that the above amount is 0.5 wt % or more to 3 wt % or less in relation to the entire ink. By setting the amount of the additive in such a range, a preferable phase separation structure can be obtained while the additive remaining in the active layer 132 is decreased.

<Electrodes (120, 140)>

The electrodes 120, 140 in the solar cell element 100 of the embodiment have a function to collect an electron or a hole generated as a result of absorption of light by the active layer 132. Therefore, it is preferable that the first electrode 120 is suitable for collection of the electron, and it is preferable that the second electrode 140 is suitable for collection of the hole. It is preferable that at least one of the pair of electrodes 120, 140 has a light transmitting property, and the both may have the light transmitting properties. Having the light transmitting property means that 40% or more of sunlight is transmitted. It is more preferable that the electrode having the light transmitting property transmits 70% or more of sunlight, and thereby light is easily transmitted through a transparent electrode to reach the active layer 132. A transmittance of light can be measured by a common spectrophotometer, and indicates an average transmittance of visible light (400 nm to 800 nm), for example.

<Electrode (120) Suitable for Collection of Electron>

The electrode (cathode) 120 suitable for collection of an electron is generally an electrode constituted by a conductive material exhibiting a lower value of a work function than the anode 140. According to such a cathode 120, the electron generated in the active layer 132 can be extracted smoothly. As forming materials of the cathode 120, used are, for example, a metal such as lithium, sodium, potassium, cesium, calcium, and magnesium, an alloy thereof, an inorganic salt such as a lithium fluoride and a cesium fluoride, and a metal oxide such as a nickel oxide, an aluminum oxide, a lithium oxide, and a cesium oxide. These materials are materials having low work functions, and thus are suitable as the materials for the cathode 120. Further, between the cathode 120 and the active layer 132, the buffer layer 131 formed of an n-type semiconductor having conductivity can be provided. In such a case, as the forming material of the cathode 120, a material having a high work function may be used.

In a case where the cathode 120 is a transparent electrode, usable are, for example, a conductive metal oxide such as a nickel oxide, a tin oxide, an indium oxide, an indium tin oxide (ITO), a fluorine-doped tin oxide (FTO), an indium-zirconium oxide (IZO), a titanium oxide, and a zinc oxide, and a composite body or a laminated body of a metal nanowire of gold, silver, copper, or the like, or a carbon nanotube (CNT) and a conductive metal oxide, and it is especially preferable to use ITO.

A film thickness of the cathode 120 is not limited in particular, but the film thickness is preferable to be 10 nm or more to 1 μm or less and is further preferable to be 50 nm or more to 300 nm or less. If the film thickness of the cathode 120 is too thin, a sheet resistance becomes high, and if the film thickness of the cathode 120 is too thick, a light transmittance is lowered. In a case where the cathode 120 is the transparent electrode, it is preferable to select the film thickness so that both a high light transmittance and a low sheet resistance can be obtained. The sheet resistance of the cathode 120 is not limited in particular, but is preferable to be 500Ω/□ or less, more preferable to be 200Ω/□ or less, and normally is 1Ω/□ or more. In view of extracting a larger current, it is preferable that the sheet resistance is small. As forming methods of the cathode 120, there can be cited a vacuum film forming method such as vapor deposition and sputtering, a method of forming a film by applying an ink containing a nano-particle or a precursor, and so on.

<Electrode (140) Suitable for Collection of Hole>

The electrode (anode) 140 suitable for collection of a hole is generally an electrode constituted by a conductive material exhibiting a higher value of a work function than the cathode 120. Such an anode 140 can extract the hole generated in the active layer 132 smoothly. As a forming material of the anode 140, used is, for example, a metal such as platinum, gold, silver, copper, nickel, cobalt, iron, manganese, tungsten, titanium, zirconium, tin, zinc, aluminum, indium, or chromium, an alloy thereof, or the like. These materials have high work functions, and thus are suitable as the materials for the anode 140.

The aforesaid materials each can be laminated with a conductive high molecular material represented by PEDOT/PSS which is a polythiophene derivative doped with polystyrenesulfonate, or laminated with a metal oxide having a high work function such as a molybdenum oxide, a vanadium oxide, a nickel oxide, or a copper oxide. For example, it is possible to provide the buffer layer 133 constituted by the conductive high molecular material or the metal oxide between the anode 140 and the active layer 132. When laminating the conductive high molecular material or the metal oxide, a metal suitable for the anode 140 such as aluminum and magnesium can be used instead of the above-described material having the high work function, since a work function of the conductive high molecular material is high. It is also possible to use the conductive high molecular material itself as the material for the anode 140. As the conductive high molecular material, there can be cited the aforementioned PEDOT/PSS, a material made by doping polypyrrole, polyaniline, or the like with iodine or the like, and so on. In a case where the anode 140 is the transparent electrode, the aforesaid conductive metal oxide or the like is used.

A film thickness of the anode 140 is not limited in particular, but the film thickness is preferable to be 10 nm or more to 10 μm or less and is further preferable to be 50 nm or more to 500 nm or less. If the film thickness of the anode 140 is too thin, a sheet resistance becomes high, and if the film thickness is too thick, a light transmittance is lowered. In a case where the anode 140 is the transparent electrode, it is preferable to select the film thickness so that both a high light transmittance and a low sheet resistance can be obtained. The sheet resistance of the anode 140 is not limited in particular, but preferable to be 500Ω/☐ or less and more preferable to be 200Ω/☐ or less. The sheet resistance is normally 1Ω/☐ or more. In view of extracting a larger current, it is preferable that the sheet resistance is small. As forming methods of the anode 140, there can be cited a vacuum film forming method such as vapor deposition and sputtering, a method of forming a film by applying an ink containing a nano-particle or a precursor, and so on.

<Buffer Layer (131, 133)>

The solar cell element 100 of the embodiment may have, in addition to the pair of electrodes 120, 140 and the active layer 132 disposed therebetween, one or more buffer layer(s). The buffer layers can be classified into the electron extraction layer 131 and the hole extraction layer 133. In a case where first electrode 120 is a cathode and the second electrode 140 is an anode, the electron extraction layer 131 is disposed between the active layer 132 and the cathode 120, and the hole extraction layer 133 is disposed between the active layer 132 and the anode 140.

<Electron Extraction Layer (131)>

A material for the electron extraction layer 131 is not limited in particular as long as the material enables improvement of efficiency of extraction of the electron from the active layer 132 to the cathode 120. The forming materials for the electron extraction layer 131 are roughly categorized into an inorganic compound and an organic compound. The electron extraction layer 131 may be formed by using the material of only either one category of the above, or may be formed by using the materials of both categories. It is possible to use a laminated body of an inorganic compound layer and an organic compound layer as the electron extraction layer 131.

As the inorganic compound material used for the electron extraction layer 131, a salt of an alkali metal such as lithium, sodium, potassium, and cesium, and an n-type oxide semiconductor compound such as a titanium oxide ($TiO_x$) and a zinc oxide (ZnO) are preferable. As the salt of the alkali metal, a fluoride salt such as a lithium fluoride, a sodium fluoride, a potassium fluoride, and a cesium fluoride is preferable. By using such a material, when it is used in combination with the cathode 120 made of aluminum or the like, it is possible to make a work function of the cathode 120 small and to raise a voltage applied to the inside of the solar cell element 100.

When the alkali metal salt is used as the forming material for the electron extraction layer 131, a vacuum film forming method such as vacuum deposition and sputtering can be applied to form the electron extraction layer 131. Among the above, it is desirable to form the electron extraction layer 131 by vacuum deposition by resistance heating. Usage of the vacuum deposition can make damage to the other layers such as the active layer 132 smaller. A film thickness in such a case is preferable to be 0.1 nm or more to 50 nm or less, and is more preferable to be 20 nm or less. If the electron extraction layer 131 is too thin, an effect to improve efficiency of extraction of an electron becomes insufficient. If the electron extraction layer 131 is too thick, there is a possibility that a property of the element is impaired by the electron extraction layer 131 acting as a series resistance component.

When the titanium oxide is used as the forming material for the electron extraction layer 131, a vacuum film forming method such as a sputtering method can be applied to form the electron extraction layer 131. It is more preferable that the electron extraction layer 131 made of the titanium oxide is formed by a coating method. For example, it is possible to form the electron extraction layer 131 constituted by the titanium oxide by a sol gel method described in Adv. Mater. 18, 572 (2006). The film thickness in that case is normally 0.1 nm or more to 100 nm or less, and is preferable to be 5 nm or more to 50 nm or less. If the electron extraction layer 131 is too thin, an effect to improve the efficiency of extraction of the electron becomes insufficient. If the electron extraction layer 131 is too thick, there is a possibility that a property of the element is impaired by the electron extraction layer 131 acting as a series resistance component.

In a case where the zinc oxide is used as the forming material for the electron extraction layer 131, the formation can also be performed by using a vacuum film forming method such as a sputtering method. It is preferable to form the electron extraction layer 131 by using a coating method. For example, according to a sol gel method described in Sol-Gel Science, C. J. Brinker, G. W. Scherer, Academic Press (1990), the electron extraction layer 131 constituted by the zinc oxide can be formed. The film thickness in that case is normally 0.1 nm or more to 400 nm or less, and is preferable to be 1 nm or more to 50 nm or less. If the electron extraction layer 131 is too thin, an effect to improve efficiency of extraction of an electron becomes insufficient. If the electron extraction layer 131 is too thick, there is a possibility that a property of the element is impaired by the electron extraction layer 131 acting as a series resistance component.

As the organic compound material used as the electron extraction layer 131, there can be cited, for example, bathocuproine (BCP), batho phenanthrene (Bphen), (8-hydroxyquinolinato)aluminum (Alq3), a boron compound, an oxadiazole compound, a benzoimidazole compound, a naphthalenetetracarboxylic acid anhydride (NTCDA), a perylenetetracarboxylic acid anhydride (PTCDA), a phosphineoxide compound, a phosphinesulfide compound, etc., and a conductive polymer, but the organic compound material used as the electron extraction layer 131 is not limited thereto. The above-described organic compound material may be doped with a metal such as an alkali metal and an alkaline earth metal.

When the organic compound is used as the forming material for the electron extraction layer 131, a film thickness of the electron extraction layer 131 is normally 0.5 nm or more to 500 nm or less, and is preferable to be 1 nm or more to 100 nm or less. If the electron extraction layer 131 is too thin, an effect to improve efficiency of extraction of an electron becomes insufficient. If the electron extraction layer 131 is too thick, there is a possibility that a property of the element is impaired by the electron extraction layer 131 acting as a series resistance component. If the electron extraction layer 131 is formed by using a plurality of materials, an entire thickness of the electron extraction layer 131 is normally 0.1 nm or more to 100 nm or less, and is preferable to be 60 nm or less.

<Hole Extraction Layer (133)>

A material for the hole extraction layer 133 is not limited in particular as long as the material enables improvement of efficiency of extraction of the hole from the active layer 132 to the anode 140. Concretely, there can be cited a conductive polymer made by doping polythiophene, polypyrrole, polyacetylene, triphenylenediaminepolypyrrol, polyaniline or the like with at least one doping material out of a sulfonic acid and iodine. Among the above, the conductive polymer doped with the sulfonic acid is preferable, and further, PEDOT:PSS made by doping a polythiophene derivative with polystyrenesulfonic acid is more preferable. A metal oxide having a high work function such as a tungsten oxide and a molybdenum oxide may be used as the hole extraction layer 133. A thin film of a metal such as gold, indium, silver, and palladium can be also used as the hole extraction layer 133. The metal thin film may be used independently as the hole extraction layer 133. It is also possible to combine the metal thin film and the above-described conductive polymer to use the combination as the hole extraction layer 133.

A film thickness of the hole extraction layer 133 is not limited in particular, but normally the film thickness thereof is 1 nm or more to 200 nm or less. The film thickness of the hole extraction layer 133 is preferable to be 5 nm or more and preferable to be 100 nm or less. If the film thickness of the hole extraction layer 133 is too thin, uniformity becomes insufficient and there is a tendency that a short circuit occurs. If the film thickness of the hole extraction layer 133 is too thick, a resistance value is increased and there is a tendency that the hole is hard to be extracted.

<Forming Method of Buffer Layers>

A forming method of the buffer layers 131, 133 is not limited in particular. Film forming methods for several materials are as described above. Generally, when a material having sublimability is used, a vacuum film forming method such as a vacuum deposition method can be used. When a material soluble in a solvent is used, a wet coating method such as spin-coating and ink-jetting can be used.

<Substrate (110)>

The solar cell element 100 normally has the substrate 110 being a supporter. That is, the electrodes 120, 140, the active layer 132, and the buffer layers 131, 133 are formed on the substrate 110. A material for the substrate 110 is not limited in particular. As the substrate materials, there can be cited an inorganic material such as quartz, glass, sapphire, and titania, an organic material such as polyethylene terephthalate, polyethylenenaphthalate, polyethersulfone, polyimide, nylon, polystyrene, a polyvinyl alcohol, an ethylene-vinyl alcohol copolymer, a fluorocarbon resin, a vinyl chloride, polyolefin such as polyethylene, cellulose, a polyvinylidene chloride, aramid, a polyphenylene sulfide, polyurethane, polycarbonate, polyarylate, polynorbornene, and an epoxy resin, a paper material such as paper and synthetic paper, a composite material made by applying or laminating a layer which gives insulation performance on a metal such as stainless steel, titanium, aluminum, and so on. As the glass, soda glass, blue plate glass, no-alkali glass, and so on can be cited. With regard to a quality of the material of the glass, since fewer eluted ions are better, the no-alkali glass is preferable.

A shape of the substrate 110 is not limited and a shape of board, film, sheet, or the like can be used, for example. A thickness of the substrate 110 is not limited in particular, either. The thickness of the substrate 110 is normally 5 μm or more to 20 mm or less, and is preferable to be 20 μm or more to 10 mm or less. If the substrate 110 is too thin, there is a possibility that strength of the solar cell element 100 is insufficient, and if the substrate 110 is too thick, there is a possibility that a cost becomes high or a weight becomes too heavy. In a case where the substrate 110 is of glass, excessive thinness reduces mechanical strength and makes the substrate 110 easy to crack, and thus the thickness thereof is preferable to be 0.01 mm or more and more preferable to be 0.1 mm or more. Further, excessive thickness makes the substrate 110 heavy, and thus the thickness of the substrate 110 is preferable to be 10 mm or less, and is more preferable to be 3 mm or less.

<Method for Manufacturing Solar Cell Element 100>

The solar cell element 100 of the embodiment can be fabricated by sequentially forming the electrode 120, the photoelectric conversion layer 130, and the electrode 140 on the substrate 110 by the aforementioned methods. When the buffer layers 131, 133 are to be provided, the electrode 120, the buffer layer 131, the active layer 132, the buffer layer 133, and the electrode 140 are sequentially formed on the substrate 110. Further, it is preferable that a heat treatment (annealing treatment) is performed to a laminated body obtained by sequentially forming these layers on the substrate 110. By performing the annealing treatment, heat stability and durability of the solar cell element 100 sometimes improve. The annealing treatment sometimes improves adhesion between the layers, which is considered to be one of the reasons for the above.

A heating temperature is normally 200° C. or less, is preferable to be 180° C. or less, and is more preferable to be 150° C. or less. The heating temperature is normally 50° C. or more, and is preferable to be 80° C. or more. If the temperature is too low, there is a possibility that an improvement effect of the adhesion cannot be obtained sufficiently. If the temperature is too high, there is a possibility that the compound included in the active layer 132 is thermally decomposed, for example. Heating at a plurality of temperatures may be applied to the annealing treatment. A heating time is normally 1 minute or more to 3 hours or less, and is preferable to be 3 minutes or more to 1 hour or less. It is preferable that the annealing treatment is terminated when an open circuit voltage, a short-circuit current, and a fill factor, which are parameters for solar cell performance, reach predetermined values. The annealing treatment is preferable to be performed under a normal pressure, and is also preferable to be performed in an inert gas atmosphere.

The solar cell of the embodiment can be fabricated by using an arbitrary method. For example, according to a known technique, a surface of the organic thin film solar cell (solar cell element 100) is covered by an appropriate protective material in order for improvement of weather resistance, and thereby the solar cell can be fabricated. As the protective material, there can be cited a weather-resistant protective film, an ultraviolet cutting film, a gas barrier film, a getter material film, a sealant, and so on. It is possible to add a known configuration other than the above.

[Organic/Inorganic Hybrid Solar Cell]

Next, another example of the solar cell of the embodiment will be described. Here, an example where the solar cell of the embodiment is applied to an organic/inorganic hybrid solar cell will be described. The organic/inorganic hybrid solar cell has, for example, a laminated structure (inverse structure) of substrate/cathode electrode/electron extraction layer/active layer/hole extraction layer/anode electrode. Positions of the cathode electrode and the anode electrode may be reversed.

As the active layer of the organic/inorganic hybrid solar cell, an organic/inorganic hybrid perovskite compound is used. Further, as the hole extraction layer of the organic/inorganic hybrid solar cell, a p-type semiconductor material is used. The p-type semiconductor material forming the hole extraction layer contains the polymer of the embodiment described above. A concrete structure of the polymer as the p-type semiconductor material is as previously described. The hole extraction layer may contain a plurality of kinds of p-type semiconductor materials.

In the organic/inorganic hybrid solar cell, as a result that irradiating light is absorbed in the active layer containing the organic/inorganic hybrid perovskite compound, charge separation occurs in the active layer. An electron generated by the charge separation is extracted from the cathode electrode, and a hole is extracted from the anode electrode. In the organic/inorganic hybrid solar cell, buffer layers (the electron extraction layer and the hole extraction layer) similar to those of the organic thin film solar cell are usable. The organic/inorganic hybrid solar cell is fabricated by the same method as the above-described method for the organic thin film solar cell.

The organic/inorganic hybrid perovskite compound used for the active layer of the organic/inorganic hybrid solar cell has a composition represented by the following formula (28), for instance.

$$CH_3NH_4ML_3 \quad (28)$$

In the formula (28), M is at least one atom selected from a group consisting of lead (Pb) and tin (Sn), and L is at least one atom selected from a group consisting of iodine (I), bromine (Br), and chlorine (Cl).

As a method for fabricating the active layer, there can be cited a method of vacuum-depositing the aforesaid perovskite compound or its precursor, and a method in which a solution in which the perovskite compound or its precursor is dissolved in a solvent is applied, followed by heating and drying. As the precursor of the perovskite compound, there can be cited, for example, a mixture of methylammonium halide and lead halide or tin halide. The active layer is formed by applying the solution in which the perovskite compound or its precursor is dissolved in the solvent, followed by heating and drying. Alternatively, the active layer can also be formed by applying and drying a solution of lead halide or tin halide as the precursor and thereafter applying a solution of methylammonium halide, followed by heating and drying.

A kind of the solvent is not limited in particular as long as the perovskite compound or its precursor can be dissolved in the solvent uniformly. The solvent is selected from, for example, low alcohols such as methanol, ethanol, propanol, ethylene glycol, and methoxyethanol, ketones such as acetone, methyl ethyl ketone, cyclopentanone, and cyclohexanone, esters such as ethyl acetate, butyl acetate, and methyl lactate, ethers such as ethyl ether, tetrahydrofuran, and dioxane, and amides such as dimethylformamide and dimethylacetamide.

A thickness of the active layer is not limited in particular, but is preferably not less than 10 nm nor more than 1000 nm, and more preferably not less than 50 nm nor more than 600 nm. When the thickness of the active layer is 10 nm or more, uniformity of the active layer is maintained and a short circuit is hard to occur. When the thickness of the active layer is 1000 nm or less, an internal resistance can be made small, and further since a distance between the electrodes becomes small, it is possible to diffuse charges in a good condition.

In the organic/inorganic hybrid solar cell of the embodiment, the hole extraction layer (buffer layer) formed of the p-type semiconductor material containing the polymer of the embodiment described above is provided between the active layer and the anode electrode. The hole extraction layer is formed by applying a solution in which the polymer is dissolved in a solvent, for instance. A thickness of the hole extraction layer is not limited in particular, but normally is not less than 1 nm nor more than 100 nm. The thickness of the hole extraction layer is preferably not less 2 nm nor more than 50 nm. If the thickness of the hole extraction layer is too small, uniformity becomes insufficient and a short circuit tends to occur. If the thickness of the hole extraction layer is too large, a resistance value increases and it tends to be difficult to extract a hole.

The organic/inorganic hybrid solar cell of the embodiment, similarly to the aforesaid organic thin film solar cell, may include the electron extraction layer (buffer layer) provided between the active layer and the cathode electrode. A forming material and a forming method of the electron extraction layer are as previously described. Further, forming materials of the anode electrode and the cathode electrode are also as previously described. Other structure of the organic/inorganic hybrid solar cell is also the same as that of the previously described organic thin film solar cell.

EXAMPLES

Next, examples and their evaluation results will be described.

Example 1

Poly(7,8-bis(5-(2-ethylhexyl)thienyl)benzo[1,2-b:4,3-b']dithiophene-2,5-diyl-alt-(4-(2-ethylhexyloxylcarbonyl)-5-fluorothieno[3,4-b]thiophene-2,6-diyl))
[P1]

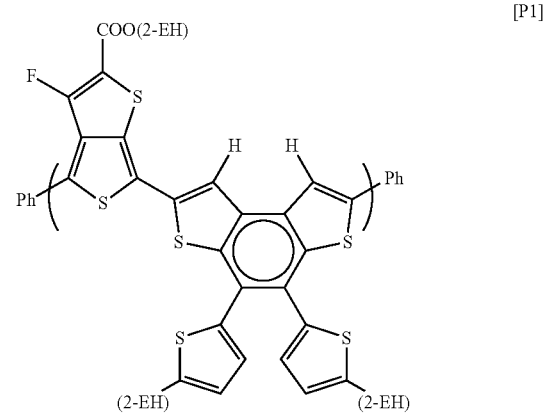

Under nitrogen, 1.406 g (1.55 mmol) 2,5-bis(trimethylstannyl)-7,8-bis(5-(2-ethylhexyl)thionyl)benzo(1,2-b:4,3-b')dithiophene and 0.078 g (0.0675 mmol) tetrakis(triphenylphosphine)palladium (catalyst) were weighed and fed into a first three-neck flask provided with a three-way cock, a reflux tube with an argon conduit was attached to the three-neck flask while argon was made to flow thereto through the three-way cock, and subsequently, in order to prevent deactivation of the catalyst due to interfusion of air, a dropping funnel was attached in a manner that the air does not enter. The argon conduit was connected to a vacuum line, so that switching between argon and vacuum is enabled. The three-way cock was closed, the inside of the flask was vacuumized, and argon was introduced again. The above operation was repeated three times.

Meanwhile, under nitrogen, 0.735 g (1.55 mmol) 4,6-dibromo-3-fluoro-thieno[3,4-b]thiophene-2-carboxylic acid 2-ethylhexyl was weighed and fed into a second three-neck flask provided with a three-way cock, and an argon conduit was attached while argon was made to flow into the three-neck flask through the three-way cock. One end (argon was made to flow from another end) of the three-way cock was opened and 24 mL toluene anhydride having been degassed was added by a syringe, and after dissolution, a resultant toluene solution was sucked out by a syringe. This toluene solution was added from one end (argon was made to flow from another) of the three-way cock of the first three-neck flask. Further, 6 mL dimethylformamide (DMF) anhydride having been degassed was added into the flask by a syringe similarly to the above and the three-way cock was closed.

This three-neck flask was heated in an oil bath, whereby a reaction was caused at a reflux temperature for 12 hours, and the three-neck flask was cooled to a room temperature. Under nitrogen, 0.128 g trimethylphenyltin was weighed and dissolved into 4 mL toluene anhydride having been degassed, the resultant was added into the flask by a syringe similarly to the above, and heat refluxing was carried out for 2 hours. After cooling down to the room temperature, under nitrogen, 0.126 g bromobenzene was weighed and dissolved into 4 mL toluene anhydride having been degassed, the resultant was added into the flask by a syringe similarly to the above, and heat refluxing was carried out for 2 hours. After cooling down to the room temperature, the above reaction solution was dropped into 1 L methanol while being stirred, to precipitate a polymer. The precipitate, after being filtered by a glass filter, was dissolved into chloroform, and then the catalyst was removed through a celite column. After the solvent was condensed by an evaporator, methanol was added, and after well stirring, filtration by using a glass filter was carried out to obtain a solid body. This solid body was vacuum-dried at 60° C. for 4 hours, and a 1.436 g (yield 95.0) copper-colored polymer having a metallic luster was obtained. By Soxhlet extraction, the obtained polymer was refined with ethyl acetate, hexane, toluene, and chlorobenzene in the order mentioned. Thereafter, a benzene extract was used.

The obtained solid body was evaluated by using an NMR device (JNM-GSX270 (brand name), produced by JEOL Ltd.). An obtained result was "1H-NMR (270 MHz, CDCl3) ∂: 8.2 to 6.7 (broad), 4.6 to 4.0 (broad), 3.3 to 2.5 (broad), 2.1 to 0.4 (m)". A peak of an aromatic proton of a benzothiophene ring and a thiophene ring of a side chain was observed at 6.7 to 8.2 ppm, a peak corresponding to $CH_2$ bonded to an oxygen atom of ester was observed at 4.0 to 4.6 ppm, a peak corresponding to $CH_2$ bonded to a thiophene ring of a side chain was observed at 2.5 to 3.3 ppm, and a peak corresponding to an alkyl group was observed at 0.5 to 2.2 ppm, and it was confirmed that the obtained solid body was an intended polymer.

Further, an evaluation by gel permeation chromatography was also carried out. When a weight-average molecular weight of polystyrene conversion was measured, by using a GPC device (HPCL: CBM20 (brand name) produced by SHIMADZU CORPORATION, column: K-504 produced by Shodex, solvent: chloroform), the weight-average molecular weight was 84000 (Mw/Mn=2.7). When an UV-vis absorption spectrum (by using A2000 (brand name) produced by SHIMADZU CORPORATION, and a chloroform solution) was measured, a maximum absorption peak (λmax) was 703 nm.

The 2,5-bis(trimethylstannyl)-7, 8-bis(5-(2-ethylhexyl)thionyl)benzo(1,2-b:4,3-b')dithiophene, which was used in the synthesis of the polymer, was synthesized according to a synthetic pathway shown below.

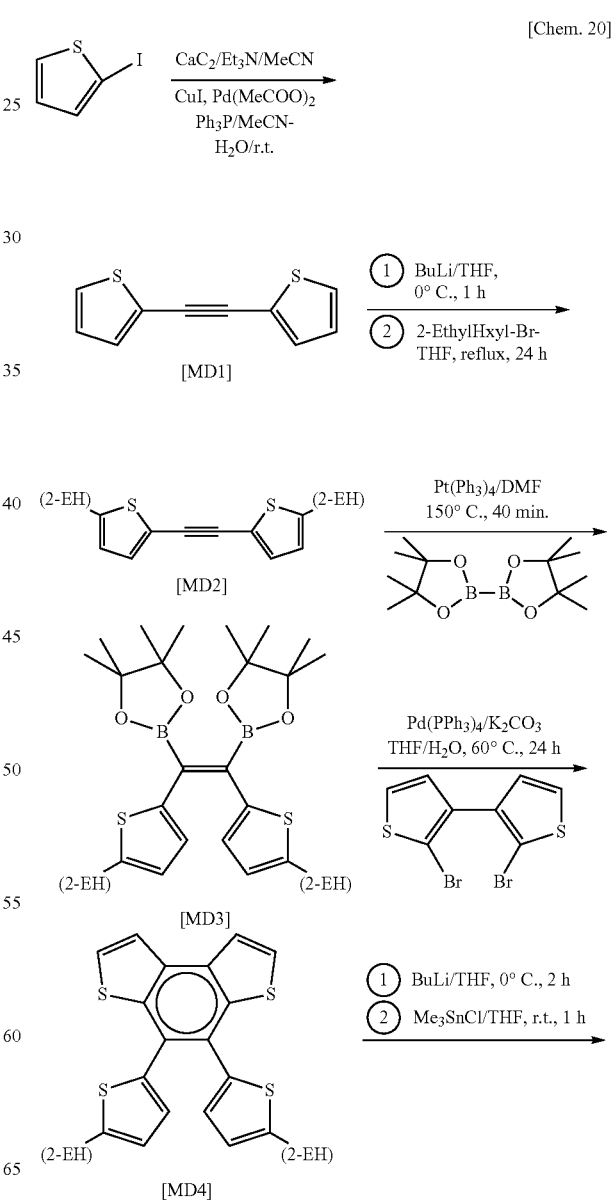

[Chem. 20]

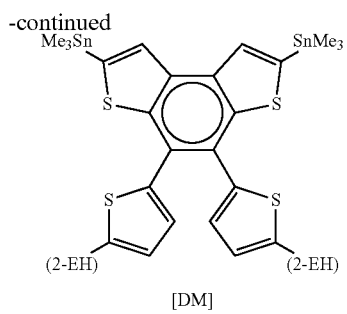

As an intermediate, 1,2-di(2-thienyl)ethyne (MD1) was synthesized. Next, by using MD1, 1,2-di(2-(5-(2ethylhexyl)thienyl)ethyne (MD2) was synthesized. By using MD2, (z)-1,2-bis(4,4,5,5-tetramethyl-1,3,2-dioxaboranyl)-1,2-di(2-(5-(2-ethylhexyl)thienyl)ethene (MD3) was synthesized. Further, by using MD3, 7,8-bis(5-(2-ethylhexyl)thionyl)benzo[1,2-b:4,3-b']dithiophene (MD4) was synthesized. Next, by using MD4, 2,5-bis(trimethylstannyl)-7,8-bis(5-(2-ethylhexyl)thionyl)benzo(1,2-b:4,3-b')dithiophene (MD) was synthesized. The 4,6-dibromo-3-fluoro-thieno[3,4-b]thiophene-2-carboxylic acid2-ethylhexyl was synthesized according to the method described in Y. Liang et al., J. Am. Chem. Soc. 2009 Vol. 131, No. 22, 7792-7799.

Example 2

Poly(7,8-bis(5-(2-ethylhexyl)thienyl)benzo[1,2-b:4,3-b']dithiophene-2,5-diyl-alt-(4-(1-heptylcarbonyl)-5-fluorothieno[3,4-b]thiophene-2,6-diyl)) [P2]

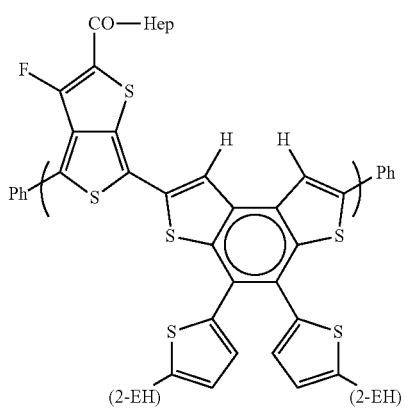

A copper-colored polymer was substantially quantitatively obtained by a synthesis under the same condition as that in the example 1 except that 4,6-dibromo-3-fluoro-2-(1-heptylcarbonyl)-thieno[3,4-b]thiophene was used instead of 4,6-dibromo-3-fluoro-thieno[3,4-b]thiophene-2-carboxylic acid2-ethylhexyl used in the example 1. By Soxhlet extraction, the obtained polymer was refined with ethyl acetate, hexane, and toluene in the order mentioned. Thereafter, a toluene extract was used.

The obtained compound was evaluated by NMR. An evaluation result was "1H-NMR (270 MHz, CDCl3) ∂: 8.2 to 6.5 (broad), 3.2 to 2.5 (broad), 2.5 to 0.5 (m)". A peak of an aromatic proton of a benzothiophene ring and a thiophene ring of a side chain was observed at 6.5 to 8.2 ppm, a peak corresponding to $CH_2$ bonded to a thiophene ring of a side chain and $CH_2$ bonded to a carbonyl group was observed at 2.5 to 3.2 ppm, and a peak corresponding to an alkyl group was observed at 0.5 to 2.5 ppm, and it was confirmed that the obtained compound was an intended polymer. When a weight-average molecular weight and an UV-vis absorption spectrum were measured by the same methods as those described above, the weight-average molecular weight of polystyrene conversion was 107000 (Mw/Mn=3.4), and a maximum absorption peak (λmax) was 714 nm.

The 4,6-dibromo-3-fluoro-2-(1-heptylcarbonyl)-thieno[3,4-b]thiophene being a monomer was synthesized according to a synthetic pathway shown below.

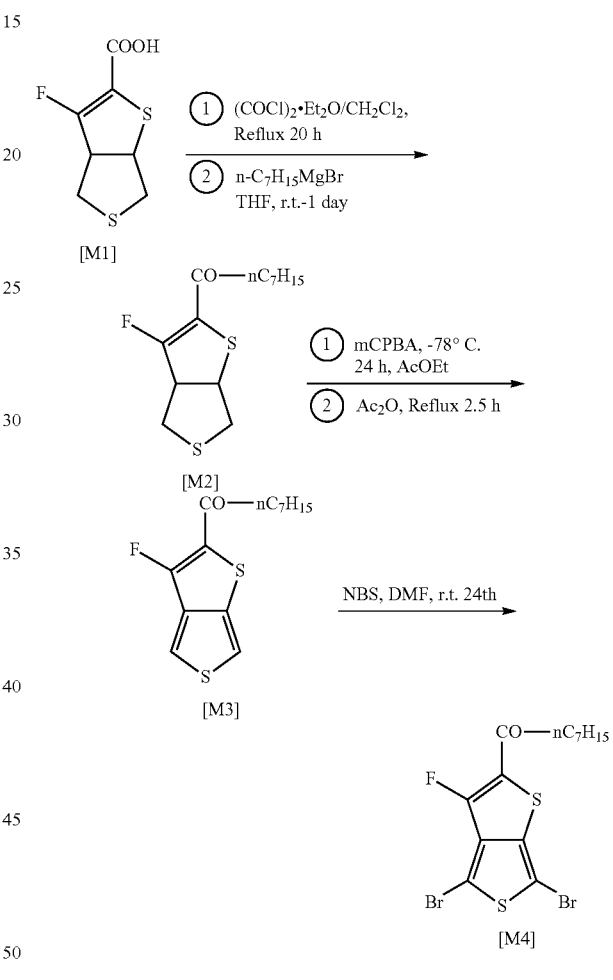

First, a reflux cooling tube with an argon conduit and a dropping funnel were attached to a three-neck flask. A magnetic stirrer was used for stirring. 5,628 g (27.6 mmol) 4,6-dihydrothieno[3,4-b]thiophene-2-carboxylic acid (M1) was added into the flask, and 30 mL anhydrous dichloromethane (DCM) was added thereto. From the dropping funnel, 7.129 g oxalyl chloride dissolved in 220 mL anhydrous DCM was added from the dropping funnel, and they were stirred at a room temperature for 20 hours. Further, 7.103 g oxalyl chloride dissolved in 100 mL anhydrous ether was added, and heat refluxing was carried out for 20 hours. From this reaction mixture, a solvent and an excessive amount of the oxalyl chloride were removed under a reduced pressure, and a blackish brown solid body was obtained. To this, 80 mL anhydrous tetrahydrofuran (THF) was added and the solid body was dissolved therein. A THF solution (30 mmol) of n-heptylmagnesium bromide which was separately synthesized was dropped at a room temperature, and heat refluxing was carried out for 2 hours. A reaction mixture was poured into water and extraction by DCM was carried out. After an organic layer was dried by magnesium sulfate anhydride, a solvent was removed under a reduced pressure, and a blackish brown oily substance was obtained. This was refined by column chromatography (silica gel, developing solvent; hexane:toluene=1:1), and a solid body of a compound M2 was obtained.

Next, a reflex cooling tube with an argon conduit and a dropping funnel were attached to a three-neck flask, and a magnetic stirrer was attached for stirring, and then 1.741 g (6.08 mmol) of the compound (M2) synthesized above was weighed and fed into the flask, and after 135 mL ethyl acetate anhydride was added and the above compound M2 was dissolved therein, the resultant was cooled to −78° C. by dry ice/acetone bathing. From the dropping funnel, 1.458 g (6.08 mmol) m-perbenzoic acid dissolved in ethyl acetate anhydride was gradually dropped. After they were made to react at −78° C. for 18 hours, the temperature was returned to a room temperature, and the solvent was removed under a reduced pressure. 100 mL acetic anhydride was added to a residue, and they were made to react by heat refluxing for 2.5 hours. A reaction mixture was refined by column chromatography (silica gel, developing solvent; hexane:chloroform=3:1 to 2:1), and a solid body of a compound M3 (1.356 g) being a pale yellow transparent solid body was obtained.

Next, a reflex cooling tube with an argon conduit and a dropping funnel were attached to a three-neck flask, and a magnetic stirrer was attached for stirring, and then 1.130 g (3.97 mmol) of the compound (M3) synthesized above was weighed and fed into the flask, and 40 mL DMF anhydride was added and the compound M3 was dissolved therein. 1.769 g (10 mmol) N-bromosuccinimide (NBS) dissolved in 30 mL DMF anhydride was dropped from the dropping funnel under a room temperature, and the resultant was stirred for one day. A sodium thiosulfate solution was poured into a reaction mixture, and chloroform extraction was carried out. After an organic layer was dried by magnesium sulfate anhydride, a solvent was removed under a reduced pressure. This was refined by column chromatography (silica gel, developing solvent; hexane:chloroform=4:1 to 3:1), and 4,6-dibromo-3-fluoro-2-(1-heptylcarbonyl)-thieno[3,4-b]thiophene (M4) (1.458 g) being a pink orange transparent solid body was obtained.

Example 3

Poly(7,8-bis(5-(2-ethylhexyl)thienyl)benzo[1,2-b:4,3-b']dithiophene-2,5-diyl-alt-(4-(2-ethylhexylcarbonyl)-5-fluorothieno[3,4-b]thiophene-2,6-diyl)) [P3]

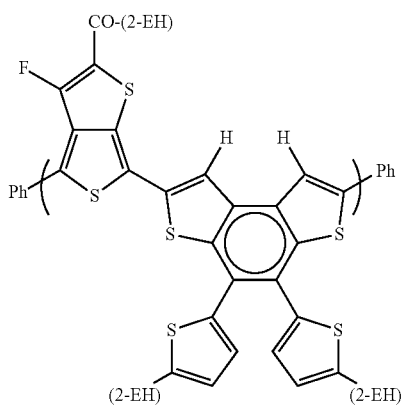

A copper-colored polymer was substantially quantitatively obtained by a synthesis under the same condition as that in the example 1 except that 4,6-dibromo-3-fluoro-2-(2-ethylhexylcarbonyl)-thieno[3,4-b]thiophene was used instead of 4,6-dibromo-3-fluoro-thieno[3,4-b]thiophene-2-carboxylic acid2-ethylhexyl used in the example 1. By Soxhlet extraction, the obtained polymer was refined with ethyl acetate, hexane, and toluene in the order mentioned. Thereafter, a toluene extract was used.

The obtained compound was evaluated by NMR. An evaluation result was "1H-NMR (270 MHz, CDCI 3) ∂: 8.2 to 6.7 (broad), 3.3 to 2.5 (broad), 2.4 to 0.5 (broad)". A peak of an aromatic proton of a benzothiophene ring and a thiophene ring of a side chain was observed at 6.7 to 8.2 ppm, a peak corresponding to $CH_2$ bonded to a thiophene ring of a side chain and $CH_2$ bonded to a carbonyl group was observed at 2.5 to 3.3 ppm, and a peak corresponding to an alkyl group was observed at 0.5 to 2.4 ppm, and it was confirmed that the obtained compound was an intended polymer. When a weight-average molecular weight and an UV-vis absorption spectrum were measured by the same methods as those described above, the weight-average molecular weight of polystyrene conversion was 65000 (Mw/Mn=2.9), and a maximum absorption peak (λmax) was 707 nm.

The 4,6-dibromo-3-fluoro-2-(2-ethylhexylcarbonyl)-thieno[3,4-b]thiophene being a monomer was synthesized by the same method in the synthetic pathway shown in the example 2 except that 2-ethylhexylmagnesium bromide was used instead of n-heptylmagnesium bromide used in the synthesis of M2.

Example 4

Poly(7,8-bis(5-(2-ethylhexyl)thienyl)benzo[1,2-b:4,3-b']dithiophene-2,5-diyl-alt-(4-(3-heptylcarbonyl)-5-fluorothieno[3,4-b]thiophene-2,6-diyl)) [P4]

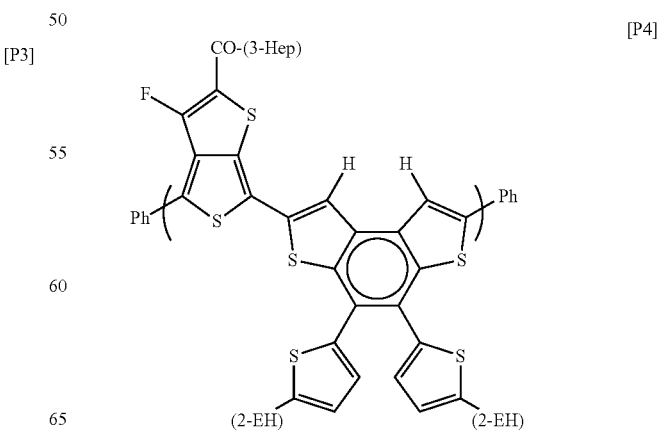

A copper-colored polymer was substantially quantitatively obtained by a synthesis under the same condition as that in the example 1 except that 4,6-dibromo-3-fluoro-2-(3-heptylcarbonyl)-thieno[3,4-b]thiophene was used instead of 4,6-dibromo-3-fluoro-thieno[3,4-b]thiophene-2-carboxylic acid2-ethylhexyl used in the example 1. By Soxhlet extraction, the obtained polymer was refined with ethyl acetate, hexane, and toluene in the order mentioned. Thereafter, a toluene extract was used.

The obtained compound was evaluated by NMR. An evaluation result was "1H-NMR (270 MHz, CDCl3) ∂: 8.2 to 6.5 (broad), 3.3 to 2.5 (broad), 2.5 to 0.5 (broad)". A peak of an aromatic proton of a benzothiophene ring and a thiophene ring of a side chain was observed at 6.5 to 8.2 ppm, a peak corresponding to CH$_2$ bonded to a thiophene ring of a side chain and CH$_2$ bonded to a carbonyl group was observed at 2.5 to 3.3 ppm, and a peak corresponding to an alkyl group was observed at 0.5 to 2.5 ppm, and it was confirmed that the obtained compound was an intended polymer. When a weight-average molecular weight and an UV-vis absorption spectrum were measured by the same methods as those described above, the weight-average molecular weight of polystyrene conversion was 49000 (Mw/Mn=2.4), and a maximum absorption peak (λmax) was 709 nm.

The 4,6-dibromo-3-fluoro-2-(3-heptylcarbonyl)-thieno[3,4-b]thiophene being a monomer was synthesized by the same method in the synthetic pathway shown in the example 2 except that 3-heptylmagnesium bromide was used instead of n-heptylmagnesium bromide used in the synthesis of M2.

Example 5

Poly(7,8-bis(5-(2-ethylhexyl)thienyl)benzo[1,2-b:4,3-b']dithiophene-2,5-diyl-alt-(4-(2-ethylheptylcarbonyl)-5-fluorothieno[3,4-b]thiophene-2,6-diyl)) terminated with CF$_3$C$_6$H$_4$ [P5]

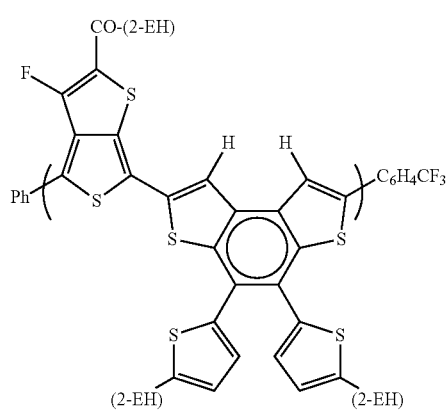

[P5]

A copper-colored polymer was substantially quantitatively obtained by a synthesis under the same condition as that in the example 3 except that 4-trifluoromethylbromobenzene was used instead of bromobenzene as end caps of the example 3. By Soxhlet extraction, the obtained polymer was refined with ethyl acetate, hexane, and toluene in the order mentioned. Thereafter, a toluene extract was used.

The obtained compound was evaluated by NMR. An evaluation result was "1H-NMR (270 MHz, CDCl3) ∂: 8.2 to 6.7 (broad), 3.3 to 2.5 (broad), 2.4 to 0.5 (broad)". A peak of an aromatic proton of a benzothiophene ring and a thiophene ring of a side chain was observed at 6.7 to 8.2 ppm, a peak corresponding to CH$_2$ bonded to a thiophene ring of a side chain and CH$_2$ bonded to a carbonyl group was observed at 2.5 to 3.3 ppm, and a peak corresponding to an alkyl group was observed at 0.5 to 2.4 ppm, and it was confirmed that the obtained compound was an intended polymer. When a weight-average molecular weight and an UV-vis absorption spectrum were measured by the same methods as those described above, the weight-average molecular weight of polystyrene conversion was 62000 (Mw/Mn=2.6), and a maximum absorption peak (λmax) was 708 nm.

Example 6

Poly(7,8-bis(5-(2-ethylhexyl)thienyl)benzo[1,2-b:4,3-b']dithiophene-2,5-diyl-alt-(4-(2-ethylhexylcarbonyl)-5-fluorothieno[3,4-b]thiophene-2,6-diyl)) terminated with CF$_3$C$_6$H$_4$ and CH$_3$OC$_6$H$_4$ [P6]

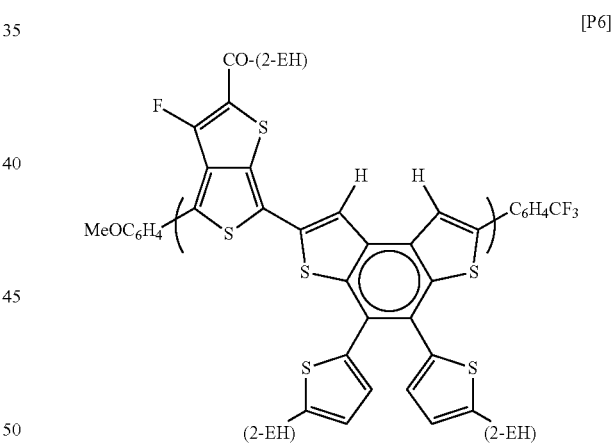

[P6]

A copper-colored polymer was substantially quantitatively obtained by a synthesis under the same condition as that in the example 3 except that 4-trifluoromethylbromobenzene and 4-methoxy-tri-1-methylstannylbenzene were used instead of bromobenzene and trimethylstannylbenzene as end caps of the example 3. By Soxhlet extraction, the obtained polymer was refined with ethyl acetate, hexane, and toluene in the order mentioned. Thereafter, a toluene extract was used. When a weight-average molecular weight and an UV-vis absorption spectrum were measured by the same methods as those described above, the weight-average molecular weight of polystyrene conversion was 48000 (Mw/Mn=2.1), and a maximum absorption peak (λmax) was 709 nm.

Example 7

Poly(7,8-bis(5-(2-ethylhexyl)thienyl)benzo[1,2-b:4,3-b']dithiophene-2,5-diyl-alt-(4-(2-ethylhexylcarbonyl)-5-fluorothieno[3,4-b]thiophene-2,6-diyl)) and poly(7,8-bis(5-(2-ethylhexyl)thienyl)benzo[1,2-b:4,3-b']dithiophene-2,5-diyl-alt-(4-(6-bromohexyloxy)-5-fluorothieno[3,4-b]thiophene-2,6-diyl)) [P7]

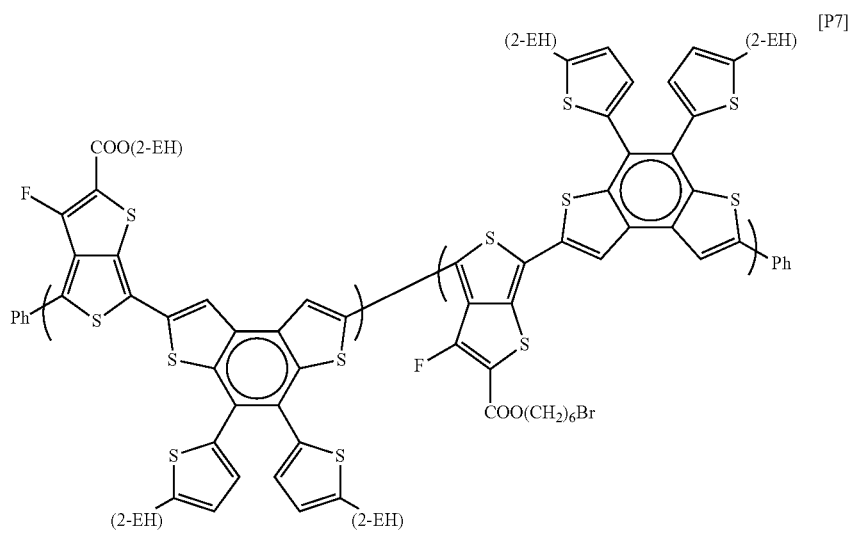

A copper-colored polymer was substantially quantitatively obtained by a synthesis under the same condition as that in the example 1 except that a mixture of 4-6-dibromo-3-fluoro-thieno[3,4-b]thiophene-2-carboxylic acid2-ethylhexyl and 4,6-dibromo-3-fluoro-thieno[3,4-b]thiophene-2-carboxylic acid6-bromohexyl (4,6-dibromo-3-fluoro-thieno[3,4-b]thiophene-2-carboxylic acid6-bromohexyl is 10 mol %) was used instead of 4,6-dibromo-3-fluoro-thieno[3,4,-b]thiophene-2-carboxylic acid2-ethylhexyl of the example 1. By Soxhlet extraction, the obtained polymer was refined with ethyl acetate, hexane, and toluene in the order mentioned. Thereafter, a toluene extract was used. When a weight-average molecular weight and an UV-vis absorption spectrum were measured by the same methods as those described above, the weight-average molecular weight of polystyrene conversion was 86000 (Mw/Mn=3.0), and a maximum absorption peak (λmax) was 672 nm.

Example 8

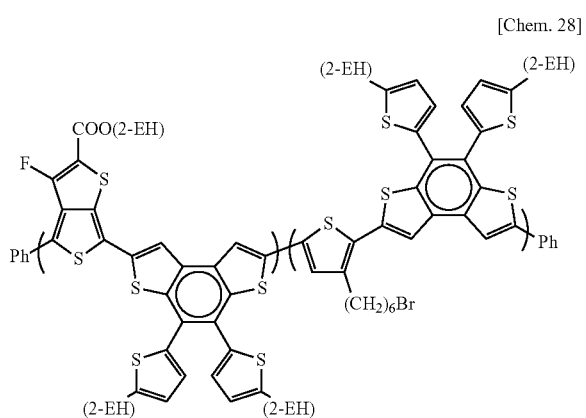

[Chem. 28]

A copper-colored polymer was substantially quantitatively obtained by a synthesis under the same condition as that in the example 1 except that a mixture of 4-6-dibromo-3-fluoro-thieno[3,4-b]thiophene-2-carboxylic acid2-ethylhexyl and 2,5-dibromo-(6-bromo)thiophene (2,5-dibromo-(6-bromo)thiophene is 10 mol %) was used instead of 4-6-dibromo-3-fluoro-thieno[3,4-b]thiophene-2-carboxylic acid2-ethylhexyl of the example 1. By Soxhlet extraction, the obtained polymer was refined with ethyl acetate, hexane, and toluene in the order mentioned. Thereafter, a toluene extract was used. When a weight-average molecular weight and an UV-vis absorption spectrum were measured by the same methods as those described above, the weight-average molecular weight of polystyrene conversion was 46000 (Mw/Mn=2.1), and a maximum absorption peak (λmax) was 620 nm.

Example 9

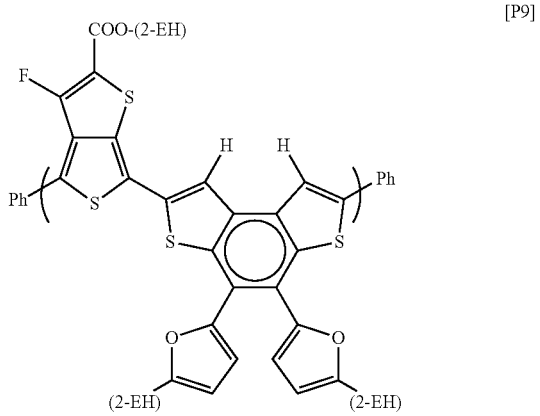

[P9]

A copper-colored polymer was substantially quantitatively obtained by a synthesis under the same condition as that in the example 1 except that 2,5-bis(trimethylstannyl)-7,8-bis(5-(2-ethylhexyl)-2-furyl)benzo(1,2-b:4,3-b')dithiophene was used instead of 2,5-bis(trim ethyl stannyl)-7,8-bis(5-(2-ethylhexyl)thionyl)benzo(1,2-b:4,3-b')dithiophene of the example 1. By Soxhlet extraction, the obtained polymer was refined with ethyl acetate, hexane, and toluene in the order mentioned. Thereafter, a toluene extract was used.

The obtained compound was evaluated by NMR. An evaluation result was "1H-NMR (270 MHz, CDCI 3) ∂: 8.2 to 6.5 (broad), 4.6 to 4.0 (broad), 3.3 to 2.5 (broad), 2.5 to 0.5 (broad)". A peak of an aromatic proton of a benzothiophene ring and a furan ring of a side chain was observed at 6.5 to 8.2 ppm, a peak corresponding to CH₂ bonded to an oxygen atom of ester was observed at 4.0 to 4.6 ppm, a peak corresponding to CH₂ bonded to a thiophene ring of a side chain and CH₂ bonded to a carbonyl group was observed at 2.5 to 3.3 ppm, and a peak corresponding to an alkyl group was observed at 0.5 to 2.5 ppm, and it was confirmed that the obtained compound was an intended polymer. When a weight-average molecular weight and an UV-vis absorption spectrum were measured by the same methods as those described above, the weight-average molecular weight of polystyrene conversion was 41000 (Mw/Mn=2.2), and a maximum absorption peak (λmax) was 694 nm.

Comparative Example 1

Poly(4,8-bis(2-ethylhexyloxy)benzo[1,2-b:4,5-b']dithiophene-2,6-diyl-alt-(4-ethylhexyloxy carbonyl)-5-fluoro-thieno[3,4-b]thiophene-2,6-diyl) [PTB-7] was synthesized by a known method.

Comparative Example 2

Poly(4,8-bis(2-ethylhexyloxy)-benzo[1,2-b:4,5-b']dithiophene-2,6-diyl-alt-4-(3-peptylcarbonyl)-thieno[3,4-b]thiophene-2,6-diyl) [PBDTTT-CT] was synthesized by a known method.

Comparative Example 3

Poly(4,8-bis(2-ethylhexyloxy)-benzo[1,2-b:4,5-b']dithiophene-2,6-diyl-alt-(4-octanoyl-5-fluoro-thieno[3,4-b]thiophene-2-carboxylate)-2,6-diyl) [PBDTTT-CT] was synthesized by a known method.

Fabrication of Organic Thin Film Solar Cell Elements

Examples 10 to 18, Comparative Examples 4 to 6

The polymers (P1 to P9) of the examples 1 to 9 and the polymers of the comparative examples 1 to 3, which are p-type semiconductor materials, were mixed with PC70BM being an n-type semiconductor material so that a mass ratio with PC70BM became 1:2. Next, the mixtures were dissolved in chlorobenzene in a nitrogen atmosphere so that the concentration of each of the mixtures became 2.0 mass %. 1,8-diiodooctane was added so that its ratio became 3 mass % of the whole solution, and the resultants were mixed by stirring at a 120° C. temperature for one hour by using a hot stirrer. The solutions having been mixed by stirring were cooled to a room temperature, and thereafter filtered by a 0.20 µm polytetrafluoroethylene (PTFE) filter, so that active layer coating solutions using the respective polymers were obtained.

After glass substrates on each of which a transparent conduction film of an indium tin oxide (ITO) was patterned were washed by ultrasonic cleaning with a surface active agent, water washing with ultrapure water, and ultrasonic cleaning with ultrapure water in the order mentioned, the glass substrates were dried by nitrogen blowing, and then dried by heating at 120° C. for 5 minutes in the atmosphere. Lastly, ultraviolet ozone cleaning was performed to the substrates. On each of the substrates, as an electron extraction layer, a diethoxyethane solution (2%, manufactured by SHOWA DENKO K.K.) of diethyl zinc being a precursor of zinc oxide was applied by spin coating in a nitrogen atmosphere, and the coated substrates were heated on a hot plate at 150° C. for 10 minutes in the atmosphere. A film thickness of the electron extraction layers was about 20 nm.

The active layer coating solutions of the polymers were applied by spin coating at a speed of 600 rpm under a nitrogen atmosphere on the substrates on each of which the electron extraction layer was formed, and thereby active layers with an about 90 nm thickness were formed. Thereafter, a vanadium oxide film with a 2 nm average film thickness as a hole extraction layer and silver with a 100 nm thickness as an electrode layer were sequentially formed by a resistance heating vacuum deposition method. 1 cm square solar cell elements were fabricated as described above.

Examples 19 to 20

In the same manner as in the example 10, active layer coating solutions of the polymer [P7] of the example 7 and the polymer [P8] of the example 8 were applied on substrates on each of which an electron extraction layer was formed, by spin coating at a speed of 600 rpm under a nitrogen atmosphere, whereby active layers with an about 90 nm thickness were formed. Next, the active layers were subjected to photocross linking by irradiation of UV light (254 nm, 1.9 mW/cm$^2$) for 30 minutes under an argon atmosphere. Thereafter, hole extraction layers and electrode layers were formed in the same manner as in the example 10, whereby 1 cm square solar cell elements were fabricated.

[Evaluation of Organic Thin Film Solar Cell Elements]

1 cm square metal masks were attached to the fabricated solar cell elements and a current-voltage characteristic between an ITO electrode and an Ag electrode was measured by using SPECTR solar simulator IVP0605 (brand name) with an air mass (AM) of 1.5 G and an irradiance of 100 mW/cm$^2$ produced by Asahi Spectra Co., Ltd. as an irradiation light source. Table 1 shows conversion efficiency as a measurement result. Further, in order to evaluate durability of the solar cell elements, a light deterioration rate and a heat deterioration rate were measured. The light deterioration rate was evaluated by conducting a light resistance test in conformity with C8938 of the JIS Standard. An irradiation light source with a 1.5 G air mass (AM) and a 100 mW/cm$^2$ irradiance was used and a black panel temperature was adjusted to 63° C., and irradiation was performed continuously for 70 hours. After the light irradiation, a current-voltage characteristic of each of the solar cell elements was similarly measured, and the light deterioration rate was found. The heat deterioration rate was found by similarly measuring a current-voltage characteristic after 30-minute heating at 100° C. in a nitrogen atmosphere. Results of these are shown in Table 1.

TABLE 1

| | | Organic thin film solar cell | | |
| --- | --- | --- | --- | --- |
| | Polymer | Power generation efficiency [%] | Light deterioration rate [%] | Heat deterioration rate [%] |
| Example 10 | Example 1 [P1] | 7.15 | 12 | 25 |
| Example 11 | Example 2 [P2] | 6.98 | 13 | 26 |
| Example 12 | Example 3 [P3] | 6.82 | 13 | 26 |
| Example 13 | Example 4 [P4] | 7.02 | 14 | 27 |
| Example 14 | Example 5 [P5] | 6.95 | 12 | 24 |
| Example 15 | Example 6 [P6] | 6.89 | 11 | 23 |
| Example 16 | Example 7 [P7] | 6.10 | 13 | 28 |
| Example 17 | Example 8 [P8] | 5.90 | 11 | 24 |
| Example 18 | Example 9 [P9] | 6.78 | 14 | 27 |
| Example 19 | Example 7 [P7] + photocross linking | 5.95 | 3 | 9 |
| Example 20 | Example 8 [P8] + photocross linking | 5.67 | 3 | 8 |
| Comparative Example 4 | Comparative example 1 (PTB-7) | 6.71 | 20 | 37 |
| Comparative Example 5 | Comparative example 2 (PBDTTT-CT) | 4.85 | 21 | 39 |
| Comparative Example 6 | Comparative example 3 (PBFDTTT-CF) | 5.48 | 20 | 38 |

As is obvious from Table 1, it is understood that the solar cell elements using the polymers of the examples are not only excellent in power generation efficiency but also excellent in light resistance and heat resistance. Therefore, by using the polymers of the examples, it becomes possible to provide a high-performance organic thin film solar cell having a long life. It is further understood that, by subjecting the polymer to the cross linking, light resistance and heat resistance are improved.

Fabrication of Organic/Inorganic Hybrid Solar Cell Elements

Examples 21 to 29

Lead iodide (PbI$_2$) and methylammonium iodide (CH$_3$NH$_4$I) were mixed at a 1:1 mole ratio, and this mixture was dissolved in dimethylformamide in a nitrogen atmosphere so that its concentration became 40 mass %. This solution was mixed by stirring at a 120° C. temperature for one hour by using a hot stirrer. After the solution having been mixed by stirring was cooled to a room temperature, it was filtered by a 0.45 polytetrafluoroethylene (PTFE) filter, so that an active layer coating solution was obtained.

The polymers (P1 to P9) of the examples 1 to 9 being p-type semiconductor materials were dissolved in chlorobenzene in a nitrogen atmosphere so that their concentration became 1.0 mass %. These solutions were mixed by stirring at a 120° C. temperature for one hour by using a hot stirrer. After the solutions having been mixed by stirring were cooled to a room temperature, they were filtered by a 0.20 μm PTFE filter, so that hole extraction layer coating solutions using the respective polymers were obtained.

After glass substrates on each of which a transparent conduction film of a fluorine-doped tin oxide (FTO) was patterned were washed by ultrasonic cleaning with a surface active agent, water washing with ultrapure water, and ultrasonic cleaning with ultrapure water in the order mentioned, the glass substrates were dried by nitrogen blowing, and then dried by heating at 120° C. for 5 minutes in the atmosphere.

Lastly, ultraviolet ozone cleaning was performed to the substrates. On the substrates, an ethanol solution of titanium diisopropoxide bis(acetylacetone) was applied by spin coating, and they were cooled after being heated at 450° C. for 30 minutes. The substrates were immersed in a titanium chloride (TiCl$_4$) aqueous solution at 70° C. for 30 minutes. After the substrates taken out from the aqueous solution were washed and dried, they were heated at 500° C. for 20 minutes in the air, so that electron extraction layers having an about 20 nm thickness were formed.

The substrates on each of which the electron extraction layer was formed were spin-coated with the active layer coating solution of a perovskite compound at 600 rpm in a nitrogen atmosphere and were dried at 60° C. for 30 minutes, so that active layers having an about 300 nm thickness were formed. The hole extraction layer coating solutions of the polymers were applied on the respective active layers by spin coating at 2000 rpm speed for 60 seconds, so that hole extraction layers were formed. Thereafter, films of gold with a 100 nm thickness as electrode layers were formed by a resistance heating vacuum deposition method. In this manner, 1 cm square organic/inorganic hybrid solar cell elements were fabricated.

Comparative Example 7

An organic/inorganic hybrid solar cell element was fabricated in the same manner as in the example 21 except that poly(3-hexylthiophene-2,5-diyl) (P3HT) was used as a forming material of a hole extraction layer.

Comparative Example 8

An organic/inorganic hybrid solar cell element was fabricated in the same manner as in the example 21 except that a hole extraction layer was formed as follows. 180 mg 2,2',7,7'-tetrakis(N,N-di-p-methoxyphenylamine)-9,9'-bifluorene(spiro-OMeTAD) was dissolved in 1 mL dichlorobenzene. In this solution, a 37.5 μL solution in which 170 mg bis(trifluoromethanesulfonyl)imidelithium (Li-TFSI) was dissolved in 1 mL acetonitrile was added, and further 17.5 μL 4-t-butylpyridine was added, whereby a hole extraction layer coating solution was prepared. This hole extraction layer coating solution was applied by spin coating at a 3000 rpm speed for 30 seconds, whereby a hole extraction layer was formed.

[Evaluation of Organic/Inorganic Hybrid Solar Cell Elements]

1 cm square metal masks were attached to the organic/inorganic hybrid solar cell elements and a current-voltage characteristic between an FTO electrode and an Au electrode was measured by using SPECTR solar simulator IVP0605 (brand name) with an air mass (AM) of 1.5 G and an irradiance of 100 mW/cm$^2$ produced by Asahi Spectra Co., Ltd. as an irradiation light source. Table 2 shows open circuit voltage (Voc), short-circuit current density (Jsc), filter factor (FF), and conversion efficiency as measurement results. Further, after the organic/inorganic hybrid solar cell elements were sealed with glass, they were heated on a hot plate at 90° C. for 15 minutes in a nitrogen atmosphere, and thereafter they were cooled to a room temperature. After a heating test, the same characteristics were measured and a deterioration rate was found. Table 2 shows the deterioration rate of the characteristics before and after the heating.

TABLE 2

| | | Organic/inorganic hybrid solar cell | |
|---|---|---|---|
| | Polymer | Power generation efficiency [%] | Deterioration rate [%] |
| Example 21 | Example 1 [P1] | 7.6 | 3 |
| Example 22 | Example 2 [P2] | 7.4 | 4 |
| Example 23 | Example 3 [P3] | 7.2 | 4 |
| Example 24 | Example 4 [P4] | 7.3 | 5 |
| Example 25 | Example 5 [P5] | 7.5 | 4 |
| Example 26 | Example 6 [P6] | 7.2 | 3 |
| Example 27 | Example 7 [P7] | 6.9 | 4 |
| Example 28 | Example 8 [P8] | 6.2 | 5 |
| Example 29 | Example 9 [P9] | 7.0 | 5 |
| Comparative Example 7 | P3HT | 5.7 | 4 |
| Comparative Example 8 | Spiro-OMeTAD + Li-TFSI | 9.7 | 75 |

As is obvious from Table 2, it is understood that the organic/inorganic hybrid solar cell elements using the polymers of the examples are superior in the characteristics such as the power generation efficiency as compared with the comparative example 7, and are superior in heat resistance as compared with the comparative example 8. Therefore, by using the polymers of the examples, it becomes possible to provide a high-performance organic/inorganic hybrid solar cell having a long life.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A polymer comprising a repeating unit containing at least one of a bivalent group represented by the following formula (1) and a bivalent group represented by the following formula (2),

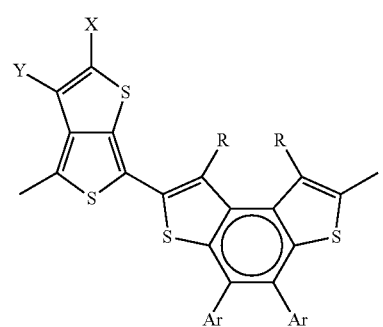

(1)

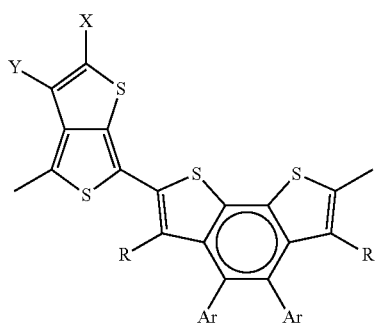

(2)

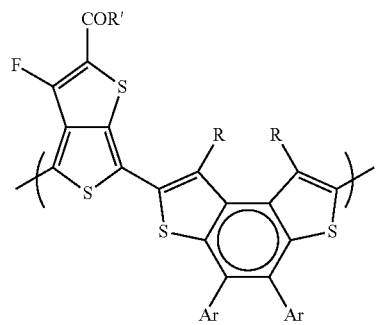

(3)

wherein R group is a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group, X group and Y group in formula (1) are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, X group and Y group in formula (2) are each independently a monovalent group selected from hydrogen, fluorine, a cyano group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, and Ar group is a monovalent group selected from a substituted or unsubstituted aryl group and a substituted or unsubstituted heteroaryl group.

2. The polymer of claim 1, comprising at least one selected from a repeating unit of the bivalent group represented by the formula (1) and a repeating unit of the bivalent group represented by the formula (2),
wherein a weight-average molecular weight of the polymer is not less than 3000 nor more than 1000000.

3. The polymer of claim 2,
wherein at least one selected from the R group, the X group, the Y group, the Ar group, and an end group of the polymer has a cross linking group.

4. The polymer of claim 1, comprising at least one selected from a repeating unit represented by the following formula (3) and a repeating unit represented by the following formula (4),

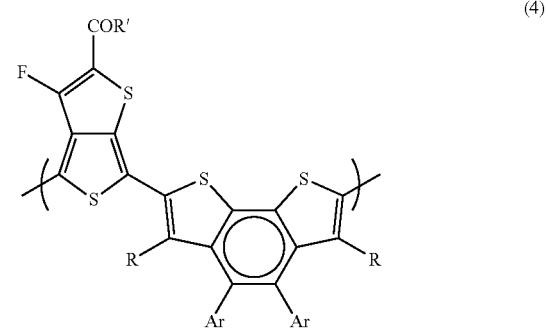

(4)

wherein R group is a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group, R' group in formula (3) is a monovalent group selected from hydrogen, a substituted or unsubstituted alkyl group, a substituted or unsubstituted alkoxy group, a substituted or unsubstituted amino group, a substituted or unsubstituted aryl group, and a substituted or unsubstituted heteroaryl group, R' group in the formula (4) is a monovalent group selected from a substituted or unsubstituted amino group and a substituted or unsubstituted heteroaryl group, and Ar group is a monovalent group selected from a substituted or unsubstituted aryl group and a substituted or unsubstituted heteroaryl group,
wherein a weight-average molecular weight of the polymer is not less than 3000 nor more than 1000000.

5. The polymer of claim 4,
wherein at least one selected from the R group, the R' group, the Ar group, and an end group of the polymer has a cross linking group.

6. The polymer of claim 1, comprising a structure represented by the following formula (5) or the following formula (6),

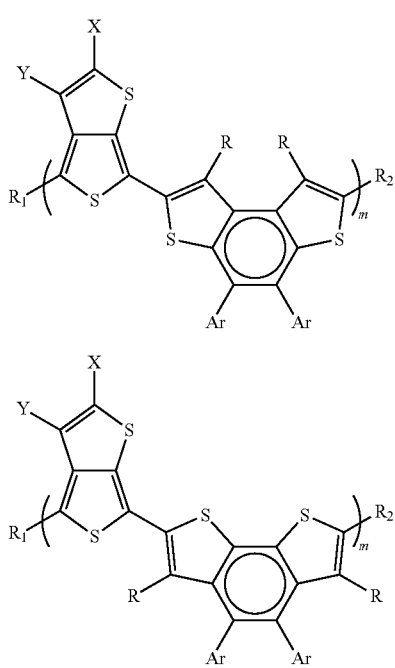

(5)

(6)

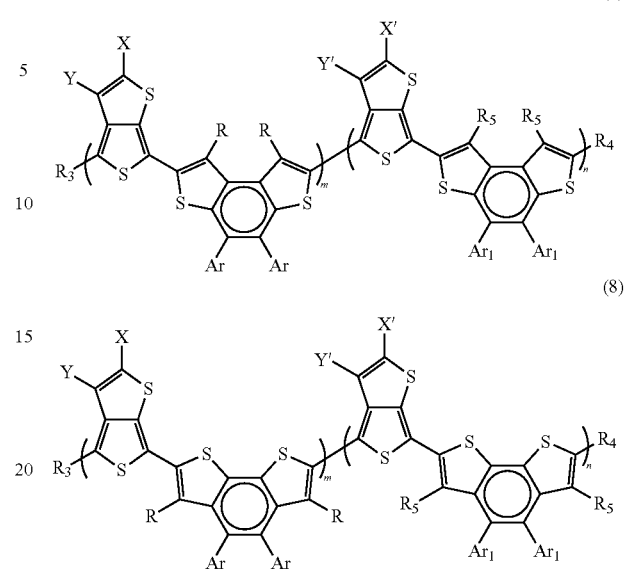

(7)

(8)

wherein R group is a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group, X group and Y group in formula (5) are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, X group and Y group in the formula (6) are each independently a monovalent group selected from hydrogen, fluorine, a cyano group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, Ar group is a monovalent group selected from a substituted or unsubstituted aryl group and a substituted or unsubstituted heteroaryl group, R1 group and R2 group are each independently a monovalent group selected from an aryl group having an electron withdrawing group and an aryl group having an electron releasing group, and m is a positive number representing a polymerization degree, wherein a weight-average molecular weight of the polymer is not less than 3000 nor more than 1000000.

7. The polymer of claim 1, comprising a structure represented by the following formula (7) or the following formula (8), wherein at least one selected from R5 group and Ar1 group has a cross-linking group, R group, R3 group, R4 group, and R5 group which does not have the cross-linking group are each independently a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group, X group and Y group in formula (7) are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, X group and Y group in the formula (8) are each independently a monovalent group selected from hydrogen, fluorine, a cyano group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, X' group and Y' group in formula (7) are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X' group and the Y' group are bonded, X' group and Y' group in the formula (8) are each independently a monovalent group selected from hydrogen, fluorine, a cyano group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X' group and the Y' group are bonded, Ar group and Ar1 group which does not have the cross-linking group are each independently a monovalent group selected from a substituted or unsubstituted aryl group and a substituted or unsubstituted heteroaryl group, and m and n are each a positive number indicating a polymerization degree, and are numbers satisfying $0.01 \le n/(n+m) \le 0.5$, wherein a weight-average molecular weight of the polymer is not less than 3000 nor more than 1000000.

8. The polymer of claim 1, comprising a structure represented by the following formula (9) or the following formula (10),

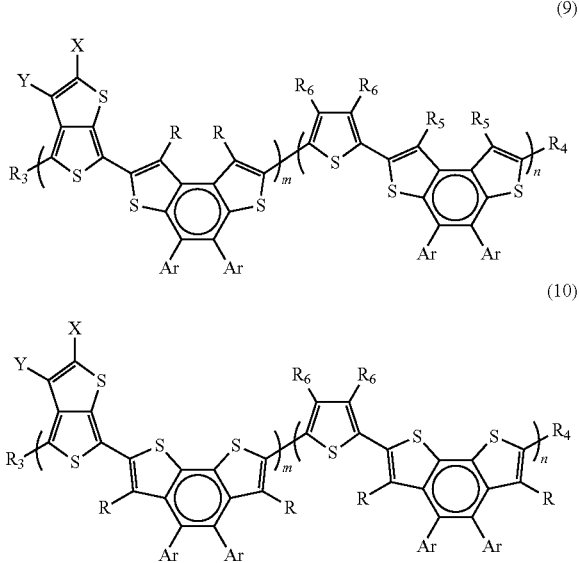

wherein at least one selected from R6 groups has a cross-linking group, R group, R3 group, R4 group, and R6 group which does not have the cross-linking group are each independently a monovalent group selected from hydrogen, fluorine, a cyano group, a nitro group, a substituted or unsubstituted alkyl group, a substituted or unsubstituted alkoxy group, a substituted or unsubstituted aryl group, and a substituted or unsubstituted heteroaryl group, X group and Y group in formula (9) are each independently a monovalent group selected from hydrogen, fluorine, a cyano group, a substituted or unsubstituted alkanoyl group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, X group and Y group in the formula (10) are each independently a monovalent group selected from hydrogen, fluorine, a cyano group, a substituted or unsubstituted aminocarbonyl group, a substituted or unsubstituted alkoxycarbonyl group, a substituted or unsubstituted alkylsulfinyl group, a substituted or unsubstituted arylsulfinyl group, a substituted or unsubstituted alkylsulfonyl group, and a substituted or unsubstituted arylsulfonyl group, or are a condensed ring in which the X group and the Y group are bonded, Ar group is a monovalent group selected from a substituted or unsubstituted aryl group and a substituted or unsubstituted heteroaryl group, and m and n are each a positive number indicating a polymerization degree, and are numbers satisfying $0.01 \le n/(n+m) \le 0.5$, wherein a weight-average molecular weight of the polymer is not less than 3000 nor more than 1000000.

9. A solar cell comprising the polymer of claim 1.

10. A solar cell comprising a first electrode, a second electrode, and a photoelectric conversion layer disposed between the first electrode and the second electrode and containing an organic material,
wherein the organic material contains the polymer of claim 1.

11. The solar cell of claim 10,
wherein the photoelectric conversion layer has an active layer containing the polymer.

12. The solar cell of claim 10,
wherein the photoelectric conversion layer has a buffer layer containing the polymer.

13. The polymer of claim 1, comprising a repeating unit containing a bivalent group represented by formula (1).

14. The polymer of claim 1, comprising a repeating unit containing a bivalent group represented by formula (2).

15. The polymer of claim 2, comprising a repeating unit of the bivalent group represented by formula (1).

16. The polymer of claim 2, comprising a repeating unit of the bivalent group represented by formula (2).

* * * * *